United States Patent [19]

Yasui et al.

[11] Patent Number: 5,359,562
[45] Date of Patent: Oct. 25, 1994

[54] SEMICONDUCTOR MEMORY HAVING POLYCRYSTALLINE SILICON LOAD RESISTORS AND CMOS PERIPHERAL CIRCUITRY

[75] Inventors: Tokumasa Yasui, Kodaira; Shinji Shimizu, Koganei; Kotaro Nishimura, Kokubunji, all of Japan

[73] Assignee: Hitachi, Ltd., Tokyo, Japan

[21] Appl. No.: 684,867

[22] Filed: Apr. 15, 1991

Related U.S. Application Data

[60] Continuation of Ser. No. 383,536, Jul. 24, 1989, abandoned, which is a continuation of Ser. No. 140,243, Dec. 31, 1987, abandoned, which is a division of Ser. No. 818,200, Jul. 22, 1977, abandoned.

[30] Foreign Application Priority Data

Jul. 26, 1976 [JP] Japan ................. 51-88159
Jun. 1, 1977 [JP] Japan ................. 52-63330
Jul. 6, 1977 [JP] Japan ................. 52-79838

[51] Int. Cl.⁵ ................. G11C 11/417; G11C 7/02; H01L 27/11
[52] U.S. Cl. ................. 365/154; 365/181; 257/297; 257/369; 257/904
[58] Field of Search ............... 365/154, 156, 174, 178, 365/181, 182; 357/41, 42, 51, 59; 257/297, 369, 904

[56] References Cited

U.S. PATENT DOCUMENTS 3,641,511 2/1972 Cricchi et al. ................. 365/156
3,760,380 9/1973 Hoffman et al. ................. 365/181
3,919,569 11/1975 Gaensslen et al. ................. 365/181
4,044,342 8/1977 Suzuki et al. ................. 365/181

FOREIGN PATENT DOCUMENTS 50-11644 2/1975 Japan .

OTHER PUBLICATIONS

"4K CMOS ROM," Denshi Zairyo, Jan. 1974, pp. 89-94.

Primary Examiner—Glenn Gossage
Attorney, Agent, or Firm—Antonelli, Terry, Stout & Kraus

[57] ABSTRACT

A semiconductor memory device is provided which has a plurality of memory cells each including a pair of cross-coupled metal insulated gate field effect transistors having channels of N-conductivity type, and a pair of load resistors of polycrystalline silicon respectively coupled to the pair of cross-coupled transistors. A peripheral circuit is also provided which is constituted by metal insulated gate field effect transistors having channels of the N-conductivity type and metal insulated gate field effect transistors having channels of P-conductivity type. The semiconductor memory device is formed in an N-type semiconductor substrate, and the pair of cross-coupled metal insulated gate field effect transistors of the memory cells are formed in a well region of P-type which forms a PN-junction with the semiconductor substrate to help reduce the susceptibility to soft errors.

14 Claims, 17 Drawing Sheets

SEMICONDUCTOR MEMORY HAVING POLYCRYSTALLINE SILICON LOAD RESISTORS AND CMOS PERIPHERAL CIRCUITRY

This is a continuation of application Ser. No. 383,536, filed Jul. 24, 1989, now abandoned, which is a continuation of application Ser. No. 140,243 filed Dec. 31, 1987, now abandoned, which is a divisional of application Ser. No. 818,200 filed Jul. 22, 1977, now abandoned.

BACKGROUND OF THE INVENTION

1. Field of the Invention

The present invention relates in general to a semiconductor device and in particular is concerned with a semiconductor memory device of a flip-flop type constituted by MISFET semiconductor devices, and a method of fabricating the same.

2. Description of the Prior Art

As a semiconductor memory devise, a dynamic flip-flop type semiconductor memory device composed of four MISFET's is disclosed in the specification of U.S. Pat. No. 3,541,530. In such a dynamic memory type of semiconductor memory device, the holding of information can be effected without supplying current constantly, to thus avoid useless power consumption. Further, the memory cell can be implemented in a small area. However, since the stored information tends to be lost due to leakage, it is required to carry out periodically the refreshing operation. Such being the case, complicated interface circuitry for the refreshing operation is required.

On the other hand, as a static memory type of semiconductor device, there is disclosed in the specification of U.S. Pat. No. 3,560,764 a flip-flop type semiconductor memory device which comprises a pair of inverter circuits cross-coupled with each other, wherein each of the inverter circuits is composed of a MISFET serving as load and a driving MISFET. In the case of such a static type semiconductor memory device no refreshing circuit is required, as differred from the dynamic type semiconductor memory device described above. However, the static type semiconductor memory device has a drawback in that power consumption is relatively large. In order to decrease the power consumption, it is necessary to make smaller the channel conductivity $\beta$ (channel width W/channel length l) in the load MISFET of the memory device. This means that the channel length l has to be selected at a greater dimension, which in turn leads to an enlarged size of the load MISFET and hence degradation in the integration density.

As an attempt to overcome the above difficulties, there is taught in Japanese Patent Application Laid-Open (Kokai) No. 50-11644 a load means which is composed of a polycrystalline silicon layer having s resistivity increased by ion implantation in place of the MISFET, thereby to enhance the integration density. However, in practice, it is impossible to reduce the occupation area of a memory cell of the static type memory device to a degree corresponding to the area for the memory cell of the dynamic type memory device. Thus, there has been a demand for a memory device which has a high integration density compatible to that of the dynamic memory type memory device and allows the refreshing to be effected in a simple and facilitated manner.

SUMMARY OF THE INVENTION

Accordingly, an object of the invention is to provide a novel and improved semiconductor memory device in which the memory cell itself is operated in a static memory mode with charge leakage being constantly compensated by current supplied through a high resistance element, while the data line is operated in a dynamic memory mode as is in the case of a flip-flop type memory cell composed by four MISFET's.

Another object of the invention is to provide a semiconductor memory device of a static memory type having a cell area substantially equal to that of the flip-flop type memory cell constituted by four MISFET's.

Still another object of the invention is to provide a semiconductor inverter device suited for the semiconductor memory device and a manufacturing process therefor.

Further object of the invention is to provide a MIS type semiconductor memory device having s high integration density by adopting multi-wiring metallization layer structure.

According to one aspect of the invention, there is proposed a semiconductor memory device for storage of information in which the memory cell thereof is constituted by four MISFET's in s dynamic flip-flop type configuration for holding electric charge representative of written-in information in an information storage means, wherein charge leakage from the information storage means is compensated by current supplied thereto through a polycrystalline silicon element having a high resistivity and connected to a source voltage supply line.

BRIEF DESCRIPTION OF THE DRAWINGS

The forgoing and other objects, features and advantage of the invention will become more apparent from the following more particular description of preferred embodiments taken in conjunction with the accompanying drawings, in which:

FIGS. 7A to 7E show in plan views a manufacturing process for fabricating the semiconductor device shown in FIG. 1, FIGS. 8A to 8E are sectional views of FIGS. 7A to 7E, wherein

DESCRIPTION OF THE PREFERRED EMBODIMENTS

Figure 1:
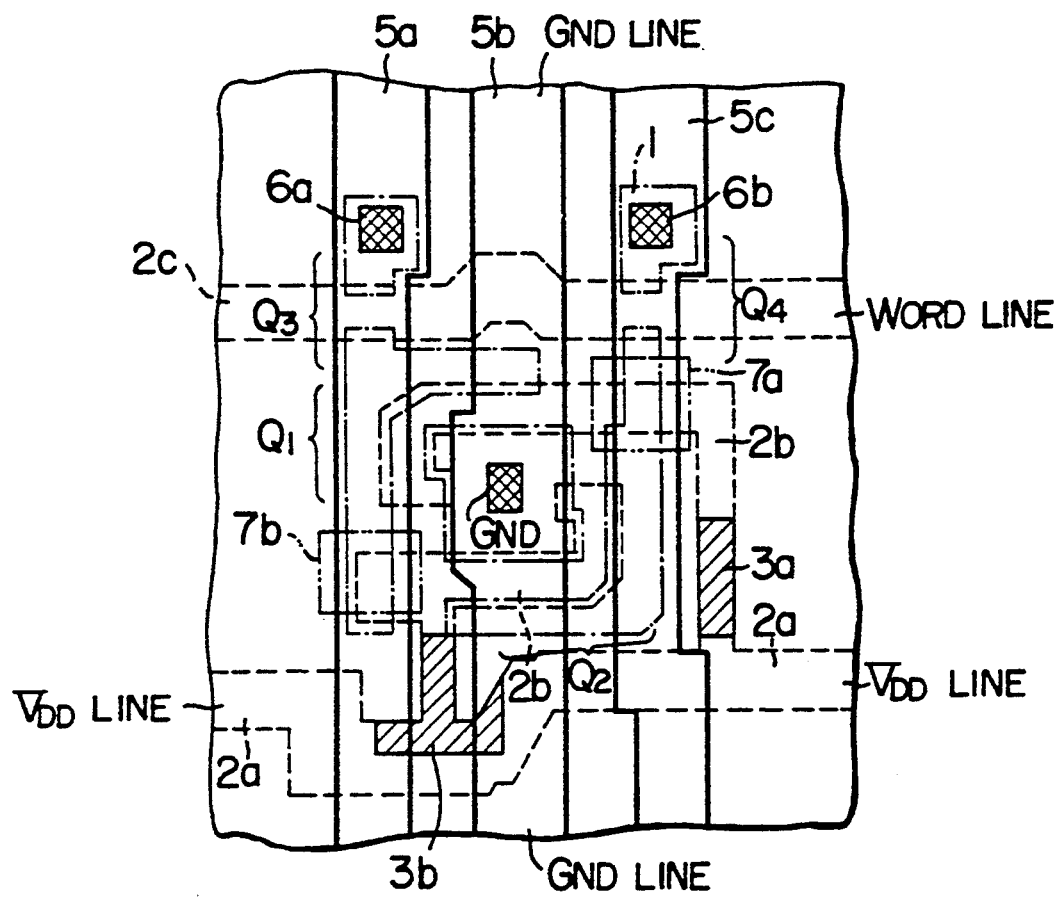
FIG. 1 is a diagram showing a layout of a semiconductor memory device according to an embodiment of the invention.

Referring to FIG. 1 which shows a layout of a semiconductor memory device according to an embodiment of the invention, a region denoted by a single-dotted broken line 1 is constituted by a diffused layer which has been formed by diffusing selectively into a surface of a semiconductor substrate an impurity of a conductivity type opposite that of the semiconductor substrate of the substance. Regions 2a, 2b and 2c as represented by broken lines are respectively constituted by a polycrystalline silicon layer with the region 2a serving as a power source line or $V_{DD}$ line, while the line 2b serves to interconnect one end of each of transmission FET's (field effect transistors) $Q_3$ and $Q_4$, source terminals of driving FET's $Q_1$ and $Q_2$, gate electrodes of the latter and load resistors $R_1$ and $R_2$. The region 2c functions as a word line. Regions 3a and 3b are formed by polycrystalline silicon layers which constitute the resistors $R_1$ and $R_2$, respectively. It will be noted that, although the resistance regions 3a and 3b are formed integrally with the polycrystalline silicon layers 2a and 2b, the former layers 3a and 3b have higher resistivity with lower impurity concentration. Reference letters 5a, 5b and 5c denote electrode wiring metallization layers of aluminium. The wiring metallization layer 5a constitutes a true digit line or d line with the wiring metallization layer 5b constituting a ground line or GND line, while the layer 5c constitutes a complementary or bar digit line or $\bar{d}$ line. Regions 6a and 6b serve as contact areas between the diffused layers constituting the respective other ends or terminals of the transmission FET's $Q_3$ and $Q_4$ and the associated electrode wiring metallization layers. Regions denoted by double-dotted broken lines 7a and 7b constitute contact areas between silicon gates of the driving FET's $Q_1$ and $Q_2$ and the diffused layers constituting the one end portions of FET's $Q_3$ and $Q_4$. At these regions, contacts are made directly to the diffused layer through polycrystalline silicon layer. Such a contacting technique as employed forming the contact regions 7a and 7b is referred to as direct contact.

Figure 2:
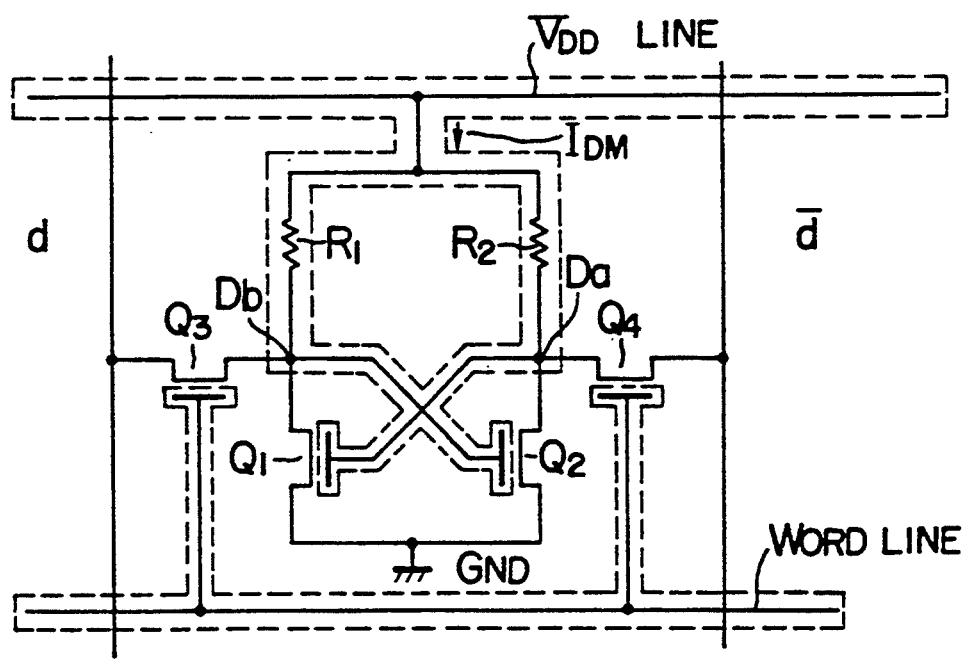
FIG. 2 is an equivalent circuit diagram of the semiconductor memory device shown in FIG. 1.

FIG. 2 shows an electric circuit diagram equivalent to the structure of the semiconductor memory device or memory cell described above in conjunction with FIG. 1. In FIG. 2, those portions as shown enclosed in broken line frames or blocks are constituted by polycrystalline silicon layers which have been simultaneously more particularly, formed. More particularly, all the regions are formed by polycrystalline silicon layers, inclusive of the source voltage line ($V_{DD}$ line) for applying voltage from an external power source except for a wire bonding pad for bonding the wire layer to be connected to a leading-out wire. Junctions Da and Db corresponds, respectively, to the direct contact portions 7a and 7b shown in FIG. 1.

Figure 3:
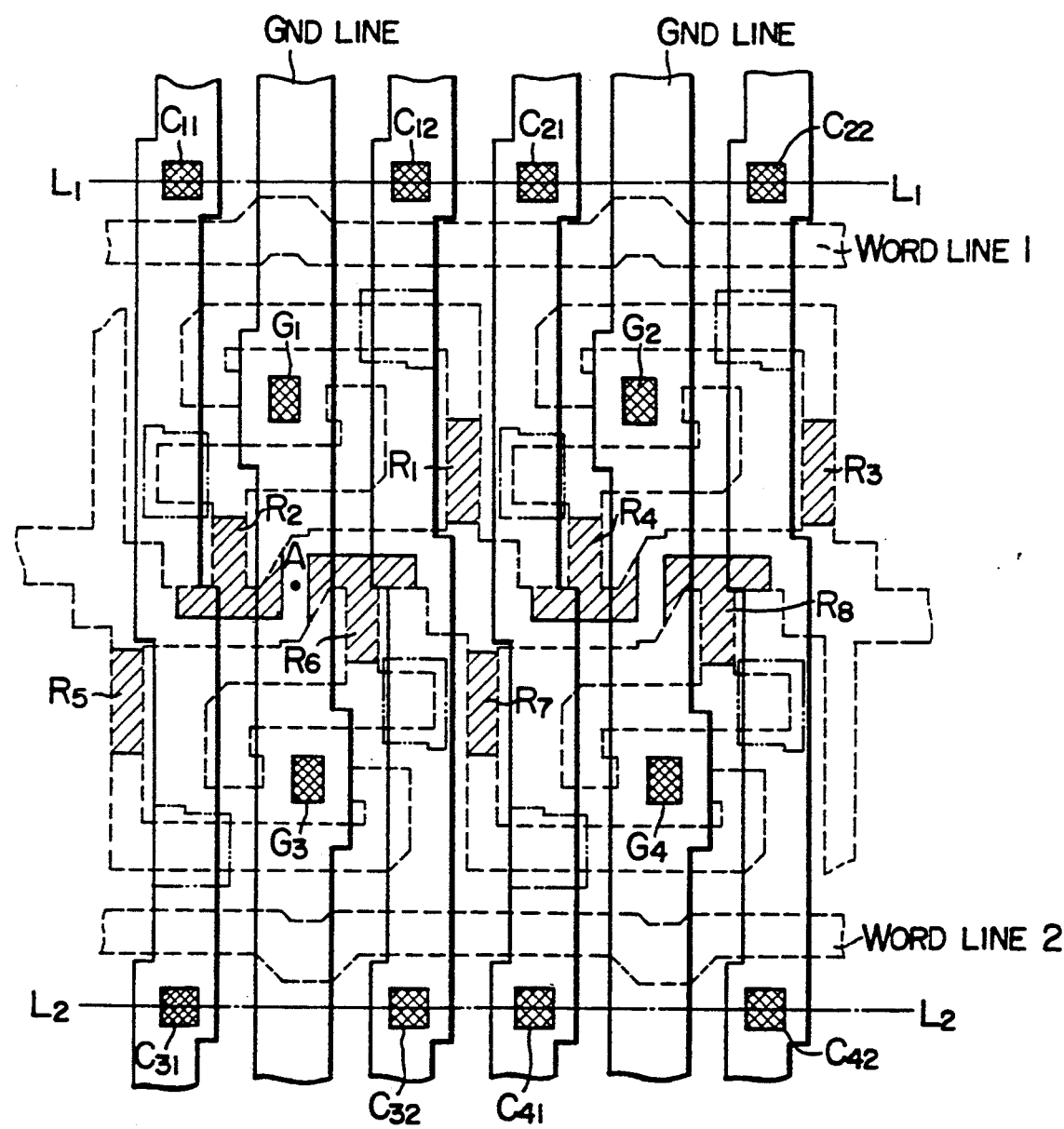
FIG. 3 shows diagrammatically a layout of a semiconductor memory array comprising four semiconductor devices shown in FIG. 1, FIGS. 4A and 4B are sectional views showing a MISFET portion and s load resistor portion, respectively.

FIG. 3 shows a layout of a semiconductor memory device including an array of four memory cells shown in FIG. 1. In FIG. 3, regions shown in broken lines are constituted by the polycrystalline silicon layers, regions shown in solid lines are aluminum (Al) wiring metallization layers, and regions shown in double-dotted broken lines represent the direct contacts. For the clarity of illustration, the diffused regions are omitted. In the figure, reference symbols $C_{11}$ and $C_{12}$ represent contact regions between the diffusion layers and the digit lines of Al for the first memory cell. These contact regions serve at the same time as contacts for other memory cells which are not shown. In a similar manner, $C_{21}$ and $C_{22}$ represent contact portions for the second memory cell, $C_{31}$ and $C_{32}$ are contact portions for the third memory cell, and $C_{41}$ and $C_{42}$ are contact portions for the fourth memory cell. It will be noted that these contact portions or regions $C_{21}$; $C_{22}$, $C_{31}$; $C_{32}$ and $C_{41}$; $C_{42}$ serve simultaneously as the contacts for other associated memory cells not shown. Since the contacts for the digit line of Al are both utilized as the contacts for the other memory cells (not shown) in the illustrated memory cell array, it may be regarded in practice that only a single contact is provided for each of the memory cell. Further, reference symbols $G_1$, $G_2$, $G_3$ and $G_4$ in FIG. 3 represent contact regions between the ground lines and the diffused layers (source regions) in the first, second, third and the fourth memory cells, respectively. Namely one contact with the ground line is required for each of the memory cells. The symbols $R_1$ and $R_2$ represent the load resistors for the first memory cell, $R_3$ and $R_4$ are load resistors for the second memory cell, $R_5$ and $R_6$ are load resistors for the third memory cell, and $R_7$ and $R_8$ are load resistors for the fourth memory cell. In respect of the geometrical array of the four memory cells, it will be seen from FIG. 3 that the second memory cell comprising $C_{21}$, $C_{22}$, $G_2$, $R_3$ and $R_4$ corresponds to the first memory cell comprising $C_{11}$, $C_{12}$, $G_1$, $R_1$ and $R_4$ and having been shifted laterally or horizontally to the right as viewed in FIG. 3. Further, the array of the third memory cell including $C_{31}$, $C_{32}$, $G_3$, $R_5$ and $R_6$ can be obtained geometrically by rotating the first cell for 180° about a point "A". The fourth memory cell including $C_{41}$, $C_{42}$, $G_4$, $R_7$ and $R_8$ may be considered as the array of the third memory cell shifted or displaced laterally to the right as viewed in FIG. 3. The memory device composed of the four memory cells shown in FIG. 3 may be expanded in the vertical direction (in the column direction) by providing other memory cells in a symmetrical array relative to the line $L_1$—$L_1$ and/or line $L_2$—$L_2$, while in the horizontal direction (in the row direction) other memory cells may be additionally provided in the same configuration as the individual memory cells described above but displaced in the horizontal direction, whereby a memory matrix of a given number of the memory cells can be formed.

Next, description will be made on MISFET regions and the load resistor portions.

Figure 4A:
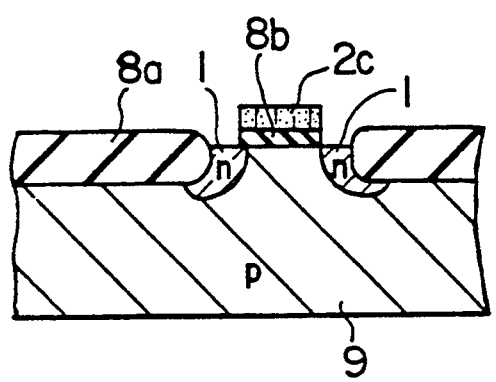

FIG. 4A shows schematically a MISFET (metal-insulator-semiconductor field effect transistor) of a LOCOS (local oxidation of silicon) structure for facilitating the multi-layer wiring metallization. In the figure, reference numeral 1 denotes a diffused layer, 8a denotes s $SiO_2$ film for passivating the semiconductor surface, 8b denotes a gate insulating film and 9 denotes a semiconductor substrate.

Figure 4B:
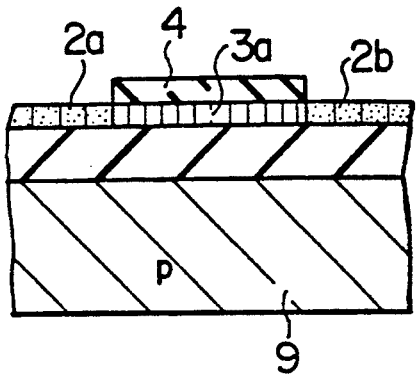

FIG. 4B shows schematically a structure of the load resistor constituted by polycrystalline silicon layer. Polycrystalline silicon regions 2a, 2b and 2c (FIG. 4A) are of a low resistivity and utilized as the wiring layers, while a polycrystalline silicon region 3a of a high resistivity is intended to serve as the load resistor. Reference numeral 4 denotes a CVD-$SiO_2$ film. The structure is shown in the state immediately after the impurity has been introduced into the polycrystalline silicon layer.

Figure 5A:
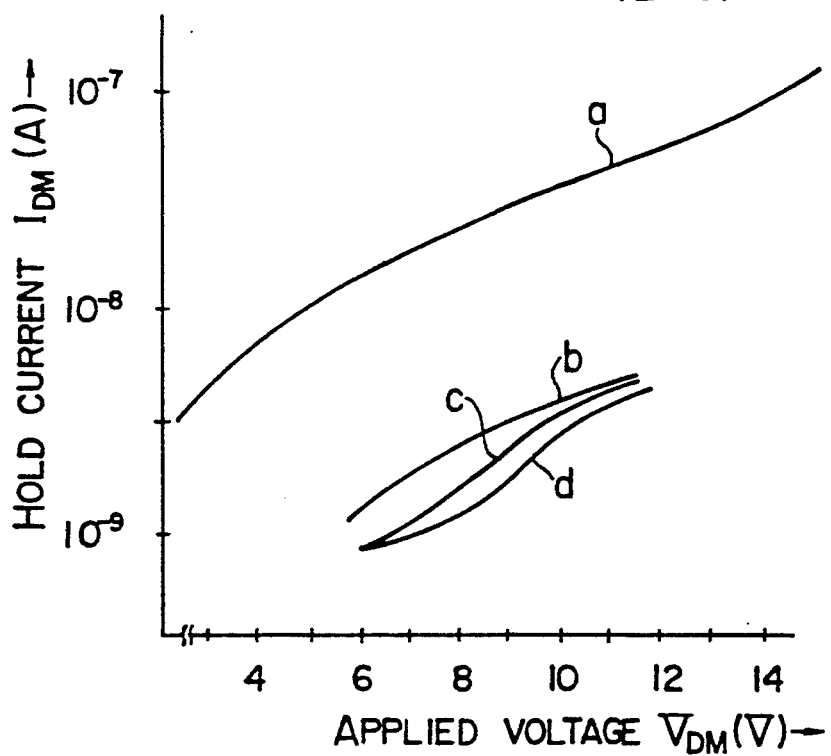
FIGS. 5A and 5B illustrate graphically correlation between information holding currents and applied voltages in a semiconductor memory device.
Figure 5B:
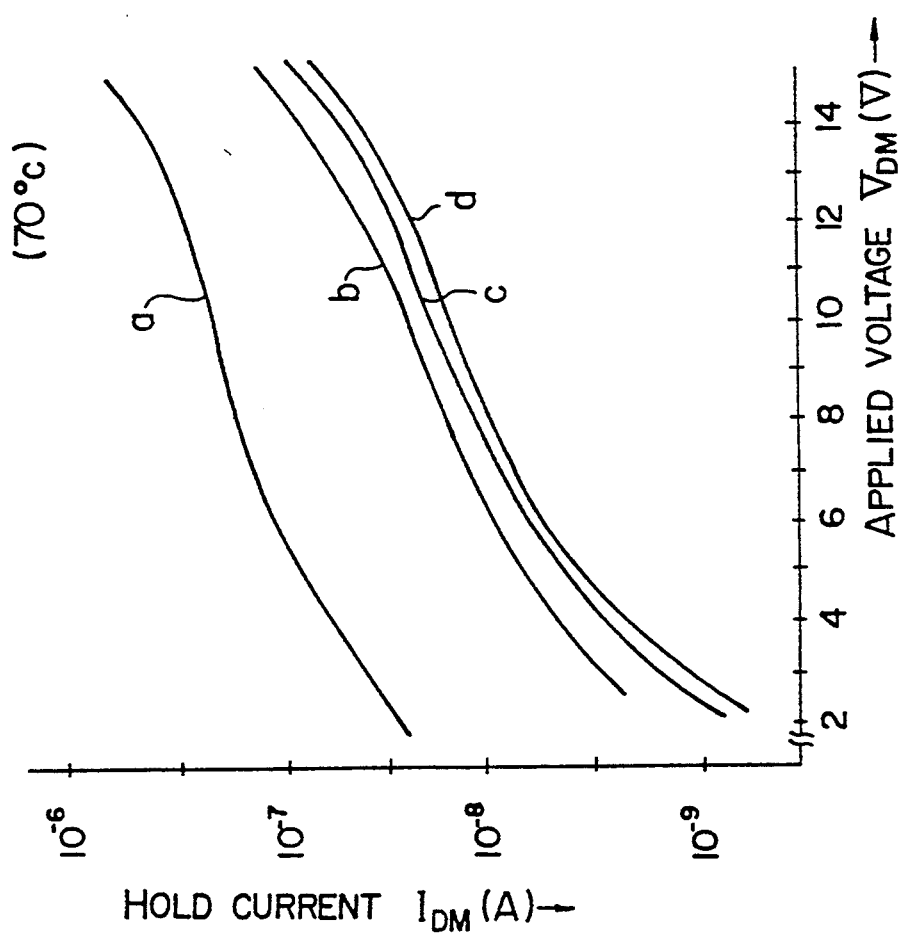

FIGS. 5A and 5B graphically illustrate how much current should be fed through the load means in order to hold stored information at different temperatures (room temperature of 25° C. in the case of FIG. 5A and 70° C. in FIG. 5B), respectively. In these figures, relationships between the holding currents $I_{DM}$ and the applied voltages $V_{DM}$ in two memory cells are illustrated in connection with four different information samples a, b, c and d. It will be noted that the holding current $I_{DM}$ is the one caused to flow through the source voltage line ($V_{DD}$ line) shown in FIG. 2 upon application of the voltage $V_{DM}$ thereto.

As can be seen from the graph shown in FIG. 5A which is plotted at the room temperature of 25° C., even in the case of the sample a which requires the greatest holding current, the amount on the order of $5 \times 10^{-8}$ A for each memory cell will be sufficient for holding the stored information at the source voltage $V_{DD}$ of 12 V. Accordingly, power consumption per memory cell will become only on the order of $0.6 \times 10^{-6}$ W (i.e. 0.6 μW).

When the temperature of the device is increased, the current required for holding information will be also correspondingly increased, because current leakage through junction will increase as a function of temperature rise. This will be clearly seen from FIG. 5B which shows the relationships between the holding current $I_{DM}$ and the applied voltage as regards to the identical samples with those of FIG. 5A but at a high temperature, say, 70° C.

In general, the current leakage will be increased as the device temperature rises. However, according to the teaching of the invention, there is no fear that the information holding should be disabled due to the temperature rise. This is because the current supply to the memory cell is increased as the current leakage increases, by virtue of the fact that the resistivity of the polycrystalline silicon layer constituting the load means according to the teachings of the invention is decreased as a function of rise in temperature.

Figure 6:
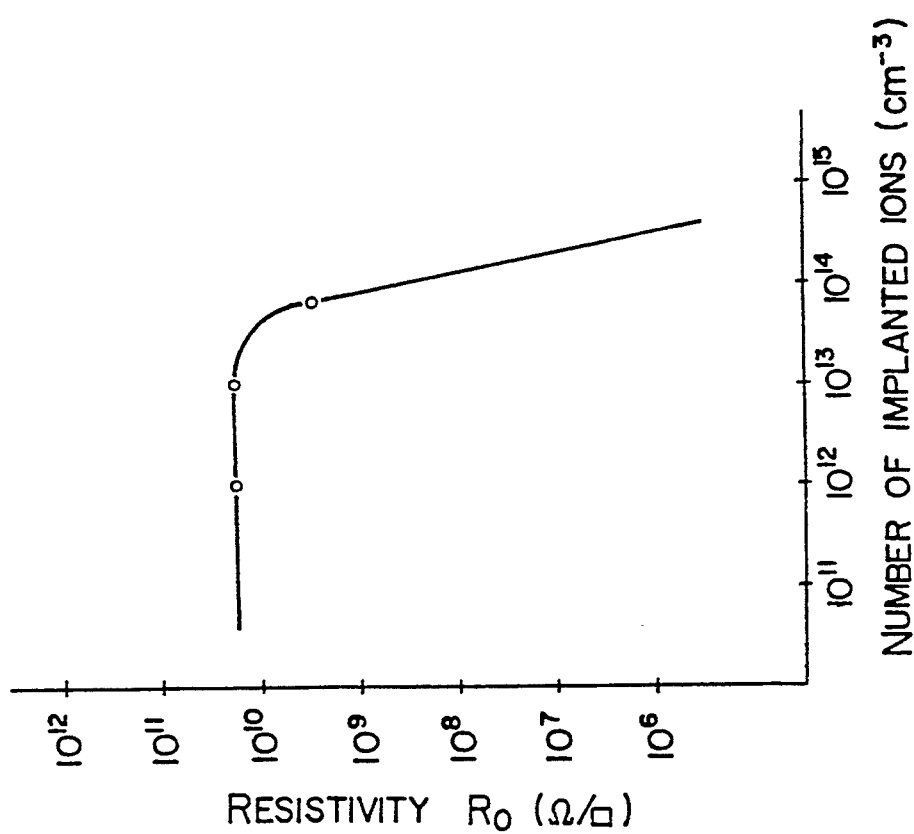
FIG. 6 illustrates graphically the correlation between the number of impurity ions implanted into a polycrystalline silicon and the resultant resistivity thereof.

The resistivity of the portion of polycrystalline silicon layer constituting the load means can be selectively adjusted by correspondingly adjusting the impurity concentration through ion implantation process, for example. FIG. 6 illustrates graphically a relationship between the resistance value of the load region and the number of implanted impurity ions. As can be seen from FIG. 6, when the number of implanted ions is in the range below $10^{15}/cm^3$, the resistivity $R_0$ remains at substantially same value of about $10^{10}$ Ω/□, which allows facilitated control of the resistivity. Of course, it becomes necessary to increase the impurity ion implantation quantity in order to reduce the resistivity in the case where a large holding current is required.

In the following, a process for fabricating the memory cell shown in FIG. 1 will be stepwise described by referring to FIGS. 7A to 7E together with FIGS. 8A to 8E.

1) In the first place, a semiconductor substrate of an appropriate geometrical configuration having a resistivity in the range of 8 to 20 Ω-cm is prepared and an oxide film 11 of about 1μ thick is formed on a surface of the substrate through a thermal treatment.

2) The oxide film is then selectively etched away in order to expose the surface region of the semiconductor substrate in which MISFET is to be formed.

Figure 7A:
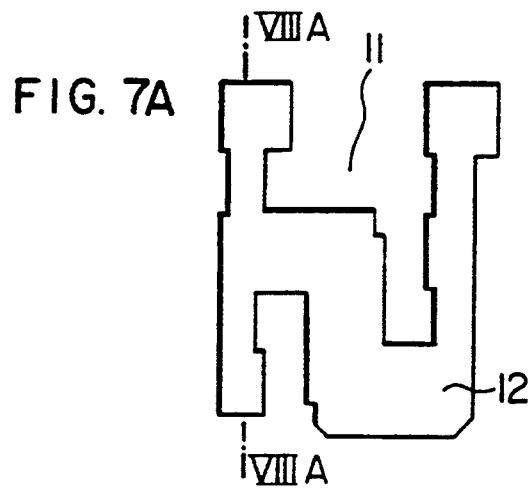
Figure 8A:
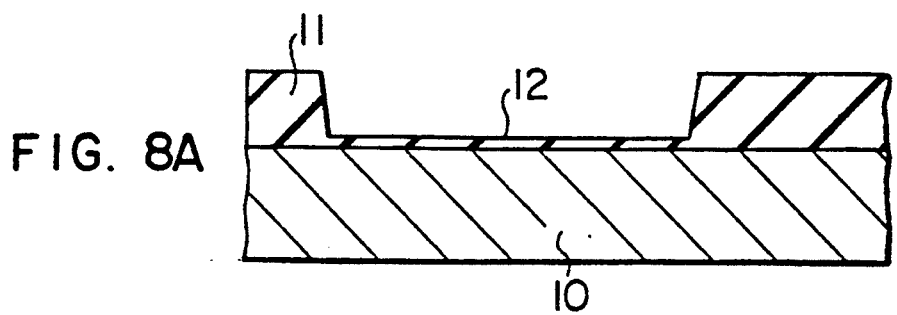
FIG. 8A is a section taking along the line VIIIA—VIIIA in FIG. 7A.

3) Subsequently, a gate oxide film ($SiO_2$) 12 of a thickness in the range of 750 to 1000 Å is formed on the exposed surface region of the semiconductor substrate (refer to FIGS. 7A and 8A).

Figure 7B:
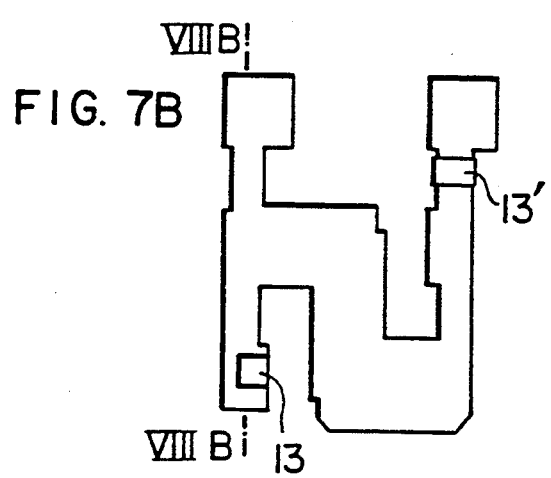
Figure 7C:
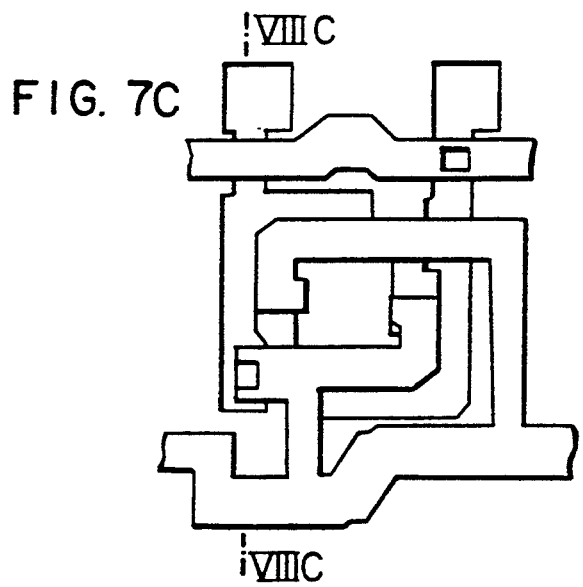
Figure 7D:
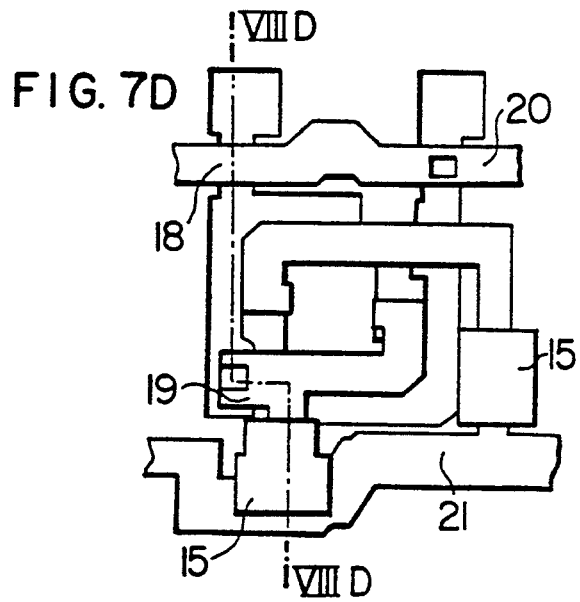
Figure 8B:
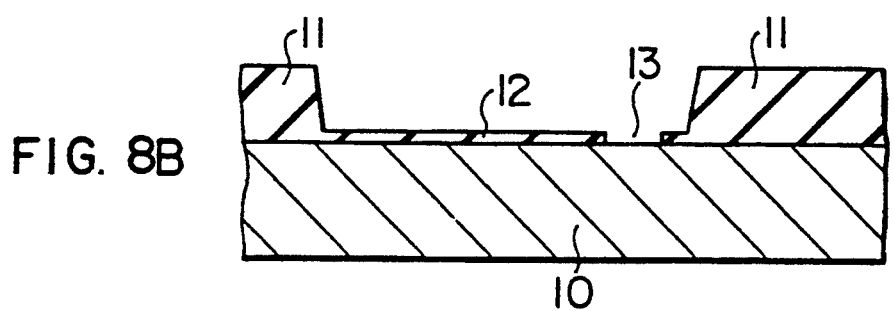
FIG. 8B is a section along the line VIIIB—VIIIB in FIG. 7B.
Figure 8C:
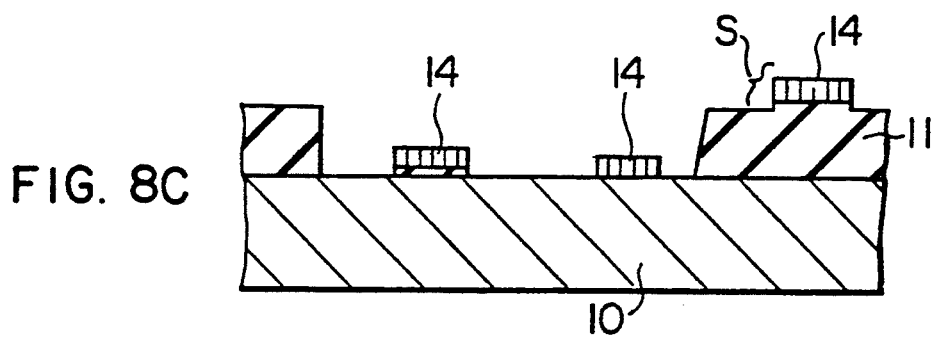
FIG. 8C is a section along the line VIIIC—VIIIC in FIG. 7C.
Figure 8D:
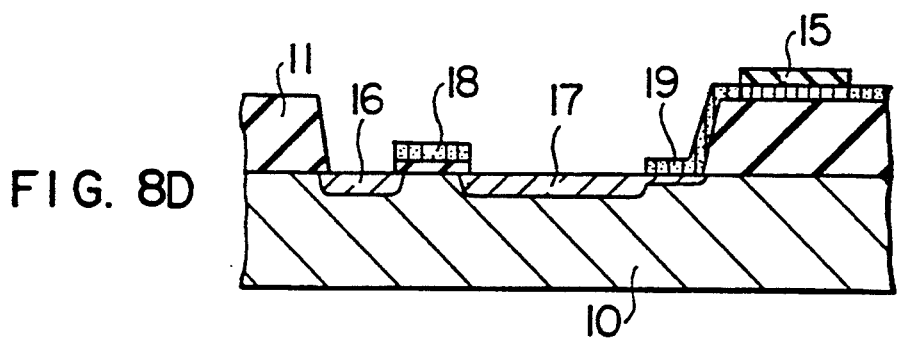
FIG. 8D shows a section along the line VIIID—VIIID in FIG. 7D.

4) The gate oxide film 12 is then subjected to a selective etching treatment thereby to form holes 13 and 13' for the direct contact with polycrystalline silicon layers described hereinbefore (refer to FIGS. 7B and 8B).

5) Subsequently, silicon is deposited through a CVD (chemical vapor deposition) process over the whole major surface of the semiconductor substrate 10 having the oxide film 11, the gate oxide film 12 and the contact holes 13 and 13', thereby to from the polycrystalline silicon layers in thickness of 3000 to 5000 Å.

6) The polycrystalline silicon layer is selectively etched away. Thereafter, the gate oxide film 12 is selectively removed through etching with the remaining polycrystalline silicon layer portions 14 being used as the mask (refer to FIGS. 7C and 8C).

7) CVD-$SiO_2$ film is formed over the whole major surface of the semiconductor substrate in thickness of 2000 to 3000 Å through CVD process.

8) The CVD-$SiO_2$ film 15 is selectively removed, with the portions thereof overlying the polycrystalline silicon layer regions at which the resistors are to be formed being rendered to remain.

9) Phosphorus is diffused into the semiconductor substrate 10 by using the polycrystalline silicon layer as the diffusion mask, thereby to form the source region 16 and the drain region 17 having impurity concentration of $10^{20}$ atoms/$cm^3$. At that time, the impurity is also driven in the polycrystalline silicon layer, whereby the gate electrode 18, the direct contact 7b, the word line 20 and the source voltage supplying or $V_{DD}$ line are simultaneously formed (refer to FIGS. 7D and 8D).

10) The CVD-$SiO_2$ film 15 is subsequently removed and a PSG (phospho-silicate glass) film 20 is formed over the whole major surface of the semiconductor substrate 10 in thickness of 7000 to 9000 Å.

11) Thereafter, aluminium (Al) film 21 of 1μ thick is formed over the whole major surface of the semiconductor substrate 10 through evaporation of Al.

Figure 7E:
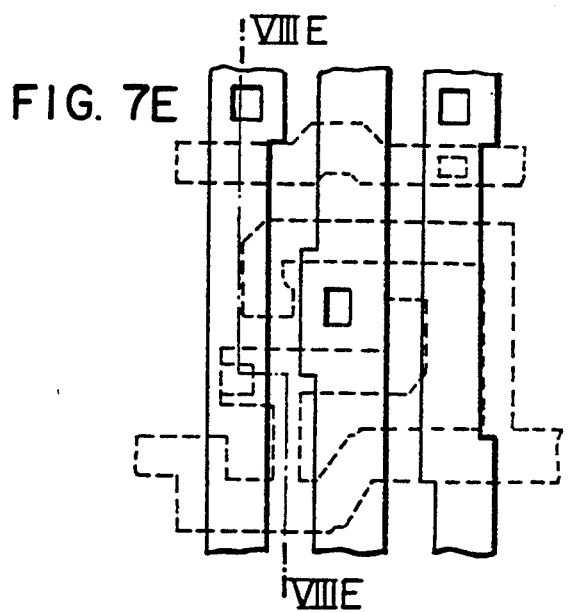
Figure 8E:
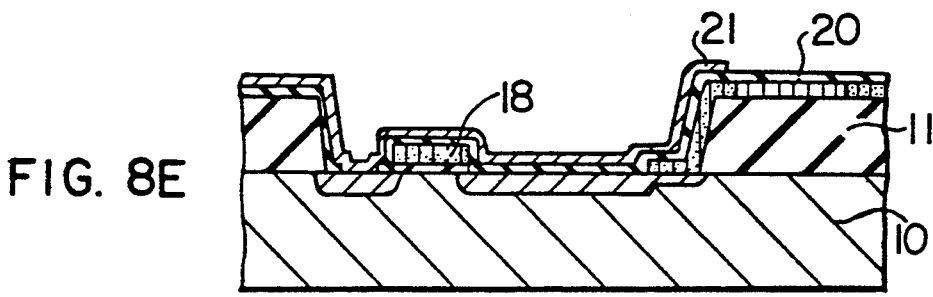
FIG. 8E shows a section along the line VIIIE—VIIIE in FIG. 7E.

12) The Al-film 21 is selectively etched away, thereby to form the ground line 22 and the digit lines 23 and 24 (refer to FIGS. 7E and 8E).

The above described process is a typical one for implementing the memory cell according to the invention. It should be, however, appreciated that the above process is susceptible to many modifications such as follows:

a) With a view to adjusting the resistivity of the load resistors $R_1$ and $R_2$, implantation of impurity ions into the polycrystalline silicon layer 14 may be carried out in succession to the step 5).

b) In place of forming the CVD-$SiO_2$ film 15 after the step 6), it is possible to deposit the $SiO_2$ film 15 through CVD treatment over the whole major surface of the semiconductor substrate 10 with the gate oxide film 12 remaining as it was. In the latter case, the offset dimension of the polycrystalline silicon layer 14 relative to the oxide film 11 as represented by S in FIG. 8C will be reduced, resulting in an improved deposition of the CVD-$SiO_2$ film 15.

c) Instead of adopting the external deposition method such as for forming the CVD-$SiO_2$ film 15, the surface of the polycrystalline silicon layer 14 may be thermally oxidized, whereby the oxide film thus produced may be used as the etching mask. In such case, the peripheral portions of the polycrystalline silicon layer can be adequately covered by the oxide film, so that the introduction of impurity can be prevented in a satisfactory manner.

d) The memory cell according to the invention is suitably adapted to be implemented in a flat LOCOS structure shown in FIG. 4A which allows the multi-layer wiring metallization in a facilitated manner. An exemplary embodiment of the LOCOS structure will be described hereinafter.

e) The film for covering the portions of the polycrystalline silicon layer at which the resistance regions are to be formed is not restricted to the CVD-$SiO_2$ film. Other suitable insulation film such as $Si_3N_4$ film may be used.

Next, description will be made on an exemplary embodiment of CMIS type semiconductor memory device in which the memory cell is composed of a flip-flop constituted by MISFET's of the same conductivity type serving as the switching means with the load means being formed of polycrystalline silicon layers of a high resistivity, while interface circuitry is formed by a CMIS type circuit.

Figure 9:
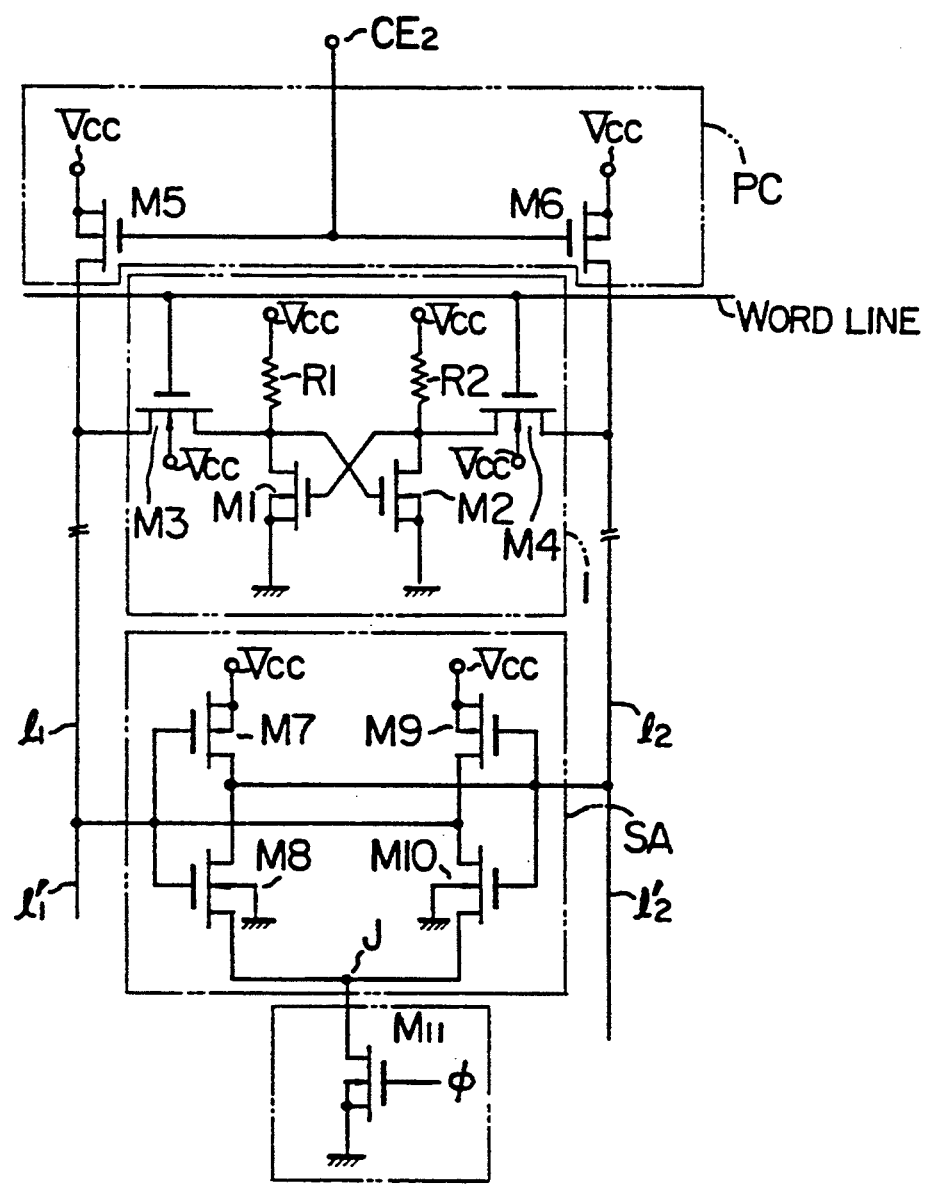
FIG. 9 is a circuit diagram showing another embodiment of the invention in which complementary MISFET (hereinafter referred to simply as CMIS) are employed for the interspace circuitry.

FIG. 9 shows a fundamental arrangement of the CMIS type memory device incorporating therein an interface circuitry of CMIS type. In the figure, reference numeral 1 designates generally a memory cell which is composed of N-channel type MISFET's $M_1$ to $M_4$ and resistors $R_1$ and $R_2$ each having a high resistivity. More particularly, the N-channel MISFET $M_1$ cooperates with the resistor $R_1$ to constitute a first inverter, while the N-channel MISFET $M_2$ and the resistor $R_2$ form together a second inverter. The first and second inverters are cross-coupled to each other, thereby to constitute a flip-flop which is a main part of the memory cell.

Symbols $M_5$ and $M_6$ denote P-channel type MISFET's which constitute together a pre-charging circuit PC and function as pre-charging transistors to attain dynamic operation.

MISFET's $M_7$ to $M_{10}$ are adapted to constitute a sense amplifier SA. MISFET's $M_7$ and $M_9$ are of P-channel type, while the other MISFET's $M_8$ and $M_{10}$ are of N-channel type. Symbol $M_{11}$ denotes a switching MISFET of N-channel type.

A pair of data lines $l_1$ and $l_2$ are connected to the sense amplifier SA, while lines $l_1'$ and $l_2'$ are connected to the output of a data input/output circuit not shown.

In operation, MISFET's $M_5$ and $M_6$ are turned on and off, respectively, in response to low and high levels of a chip selection signal $\overline{CE}$ appearing at terminal $CE_2$. When MISFET's $M_5$ and $M_6$ are turned on, capacitors (not shown) associated with the data lines $l_1$ and $l_2$ are charged. MISFET's $M_3$ and $M_4$ are turned on in response to a high level of the word signal. The sense amplifier SA is enabled for operation in response to a high level of clock signal $\Phi$ which renders the switching MISFET $M_{11}$ conductive.

In operation for reading out data from the memory cell: MISFET's $M_3$ and $M_4$ are turned on by making high the level of the word signal on the word line while the level of the chip selection signal $\overline{CE}$ is high so that the data lines $l_1$ and $l_2$ are set to signal states which are determined by the content stored in the memory cell; and thereafter by making the level of the clock signal $\Phi$ high to make the sense amplifier SA operable, the sense amplifier SA performs an amplifying operation according to the signal states of the data lines.

The write-in operation into the memory cell is effected in dependence upon the signal state set at the data lines $l_1$ and $l_2$ in response to the high level of the word signal.

It will be appreciated that the semiconductor memory device of CMIS type described above comprises N-channel type MISFET's as the driving means for the memory cell and the load means constituted by the polycrystalline silicon layers rather than P-channel MISFET's. For the interface circuitry of the memory cell, a conventional CMIS circuit configuration is adopted.

In the following, a practical example to which the CMIS-type semiconductor memory device described above can be applied will be mentioned.

Figure 10:
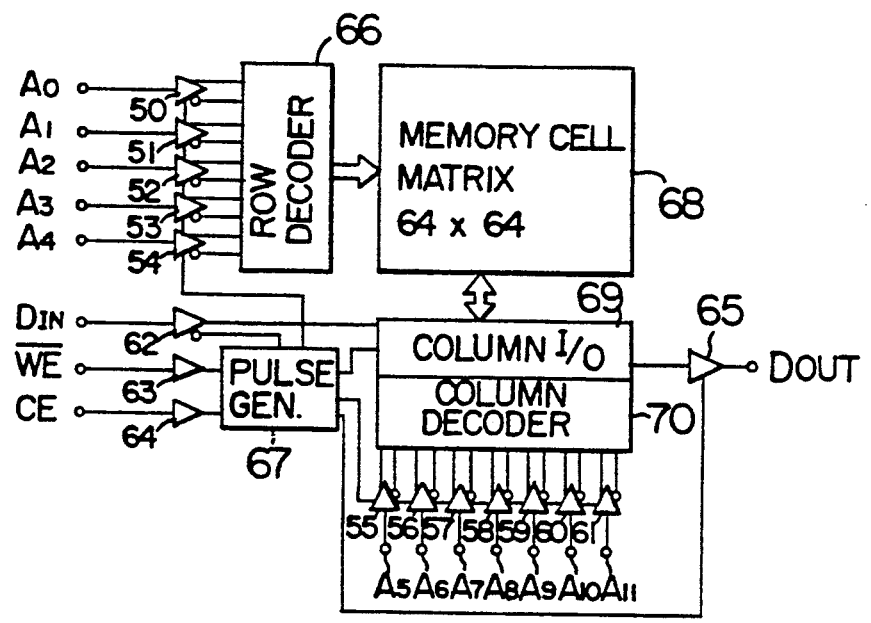
FIG. 10 is a block diagram showing a 4-bit CMIS type static random access memory or RAM.

FIG. 10 is a block diagram of a CMOS-type static random access memory or RAM of four-bit to which the CMIS-type semiconductor memory device shown in FIG. 9 can be applied. In FIG. 10, reference symbols $A_0$ to $A_{11}$ represent terminals to which addressing signals are supplied from external source, $D_{in}$ and $D_{out}$ are input and output terminals, respectively, $\overline{WE}$ is a write-enabling signal input terminal and CE is a chip-enabling signal input terminal. In succession to the various input terminals, there are provided associated buffer stages, i.e. address buffer circuits 50 to 61, an input buffer circuit 62, a write enabling signal buffer circuit 63 and a chip-enabling signal buffer circuit 64. In a similar manner, an output buffer circuit 65 is connected to the output terminal $D_{out}$. Further, numeral 66 denotes a row decoder circuit, 67 a clock generator circuit, 68 a memory cell matrix including 64×64 row and column memory cells in a matrix array, 69 an input/output circuit for the column memory cells and 70 denotes a column decoder circuit associated with the memory cells.

In the following, more detailed description will be made on the individual circuit portions shown in FIG. 10.

Figure 11:
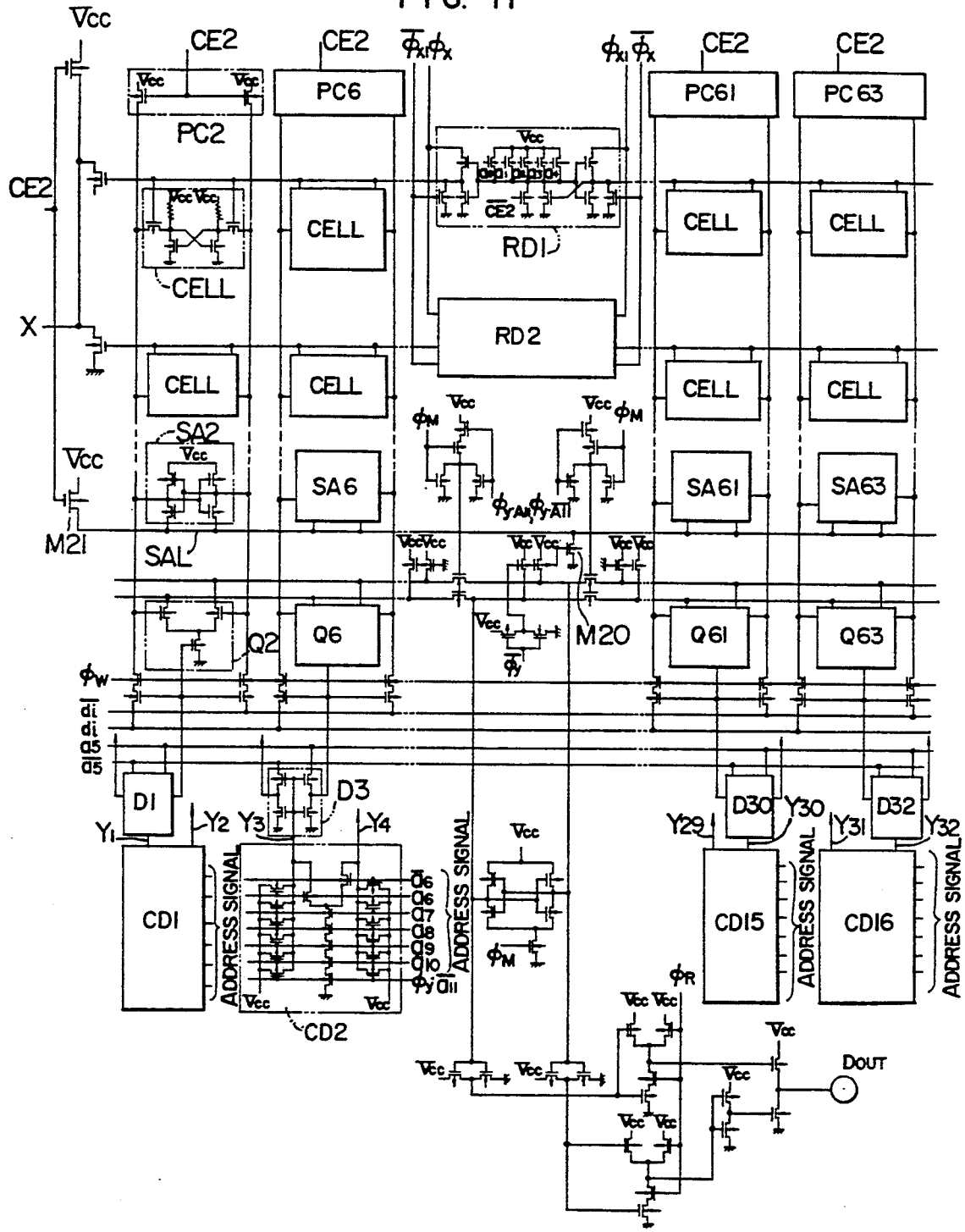
FIG. 11 is a circuit diagram showing in detail circuit portions shown in FIG. 10.

FIG. 11 is a circuit diagram showing detailed circuit arrangements of the row decoder circuit 66, the clock generator circuit 67, the memory cell matrix circuit 68, the column input/output circuit 69 and the column decoder circuit 70 which make a part of the semiconductor memory device shown in FIG. 10. In FIG. 11, RD1, RD2 and so forth denote row address decoder circuits which are provided at the center of the memory cell matrix, i.e., between the 32nd and 33rd columns, in order to accomplish a high speed operation. The blocks LD1, LD2, ..., LD16 represent column address decoder circuits each of which is adapted to output two address output signals, i.e. true and false address signals. As can be seen from the drawing, address outputs $Y_1$ and $Y_2$ are produced from the column address decoder circuit LD1. Address outputs $Y_3$ and $Y_4$ are produced from the circuit LD2, address outputs $Y_{29}$ and $Y_{30}$ are produced from the circuit LD15 and address outputs $Y_{31}$ and $Y_{32}$ are produced from the column address decoder LD16. In a similar manner, a pair of address outputs are produced from each of the other column address decoder circuits (not shown). These address outputs are coupled to respective decoder driver circuits $D_1$, $D_3$, ... $D_{30}$, $D_{32}$.

Each of the decoder driver circuit is adapted to produce two address output signals. Accordingly, with the aid of thirty-two (32) decoder driver circuits, 1st to 62nd column addresses can be selected. One row is selected by address control signals a5 and $\overline{a5}$. Symbols $Q_2$, $Q_6$, ... $Q_{61}$ and $Q_{63}$ represent buffer amplifiers. Symbols $SA_2$, $SA_6$, ..., $SA_{61}$ and $SA_{63}$ represent the sense amplifiers each of which corresponds to the one (SA) shown in FIG. 9, while $PC_2$, $PC_6$, ..., $PC_{61}$ and $PC_{63}$ are precharging circuits each of which corresponds to the one denoted by PC shown in FIG. 9 and is composed of the precharging transistors $M_5$ and $M_6$ described hereinbefore. Further, N-channel type MISFET $M_{20}$ corresponds to the switch $M_{11}$ shown in FIG. 9. P-channel type MISFET $M_{21}$ serves as a precharging transistor to hold the sense amplifier SAL at a high level (or $V_{CC}$ level) until information has been determined, thereby to inhibit operation of the sense amplifiers $SA_2$, $SA^6$, ..., $SA_{61}$ and $SA_{63}$. With such arrangement to hold the sense amplifier SAL at the high level, the sense amplifiers $SA_2$, etc. can be protected from erroneous operation due to external noises. In the case of the circuit shown in FIG. 9, when MISFET $M_{11}$ is in the off state, the junction J will be in the floating state which is favorable to reception of noise. Thus, there arises a possibility that erroneous operation may be effected without information on the lines $l_1$ and $l_2$ having been determined.

FIGS. 12 to 19 show in detail individual circuit configurations for obtaining signals to be inputted to the circuit shown in FIG. 11.

Figure 12:
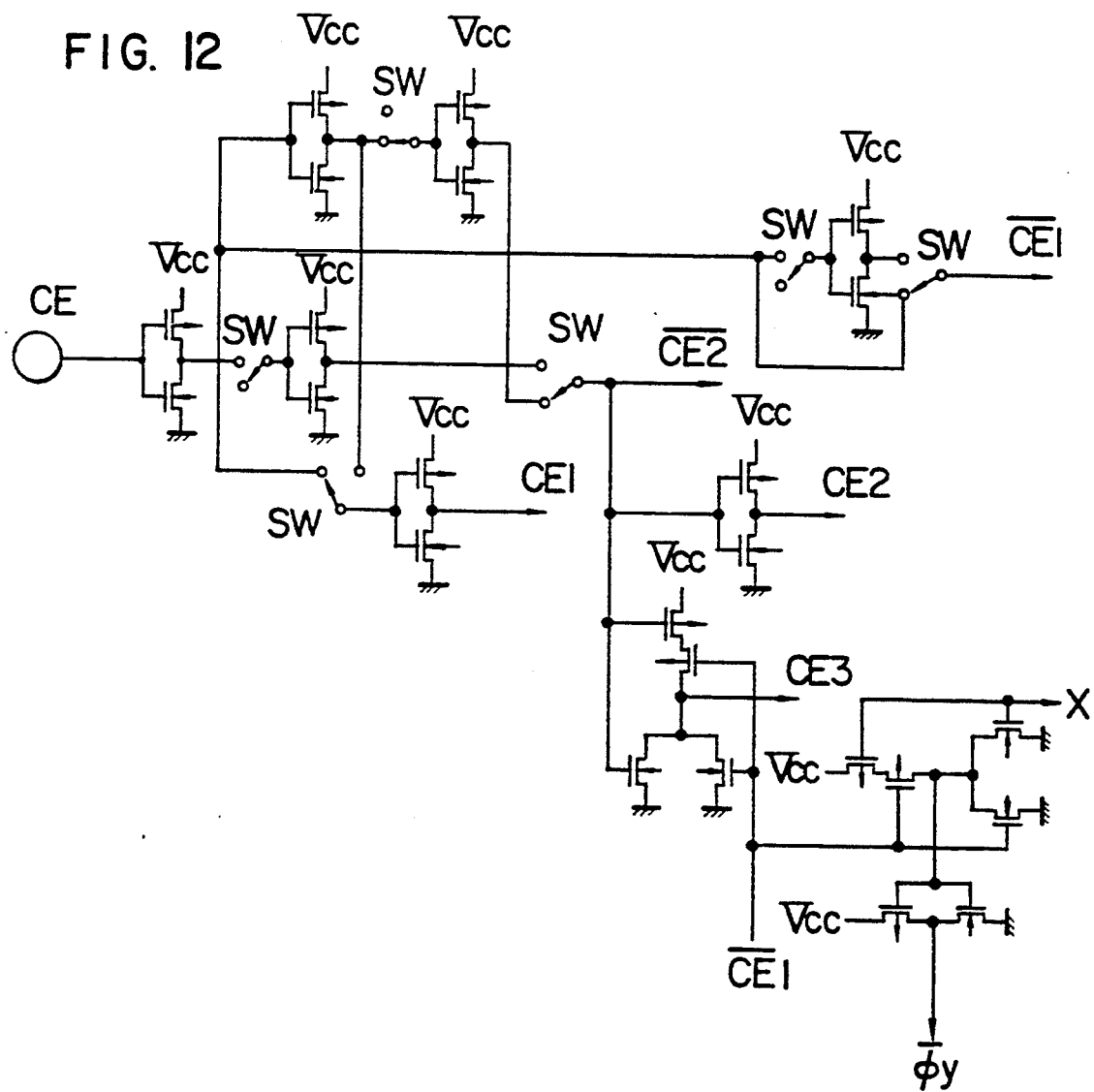
FIG. 12 is a circuit diagram showing a chip enabling buffer circuit employed in the embodiment shown in FIG. 11.

FIG. 12 is a detailed circuit diagram of the chip enable buffer circuit 64 shown in FIG. 10 which is adapted to produce internal signals $CE_1$, $\overline{CE_1}$, $CE_2$, $\overline{CE_2}$, $CE_3$, $\Phi y$ and X in response to the externally applied chip enabling signal CE. The switches SW shown in FIG. 12 are in the state to transmit therethrough the above described internal signals, when the chip enabling signal CE is applied. When the above internal signals are to be taken out in response to the external chip enabling input signal $\overline{CE}$, the states of the switches SW are changed over. Such switching of the switches SW can be realized by modifying slightly wiring arrangement in the semiconductor integrated circuit through a conventional process commonly known as master slice technic.

Figure 13:
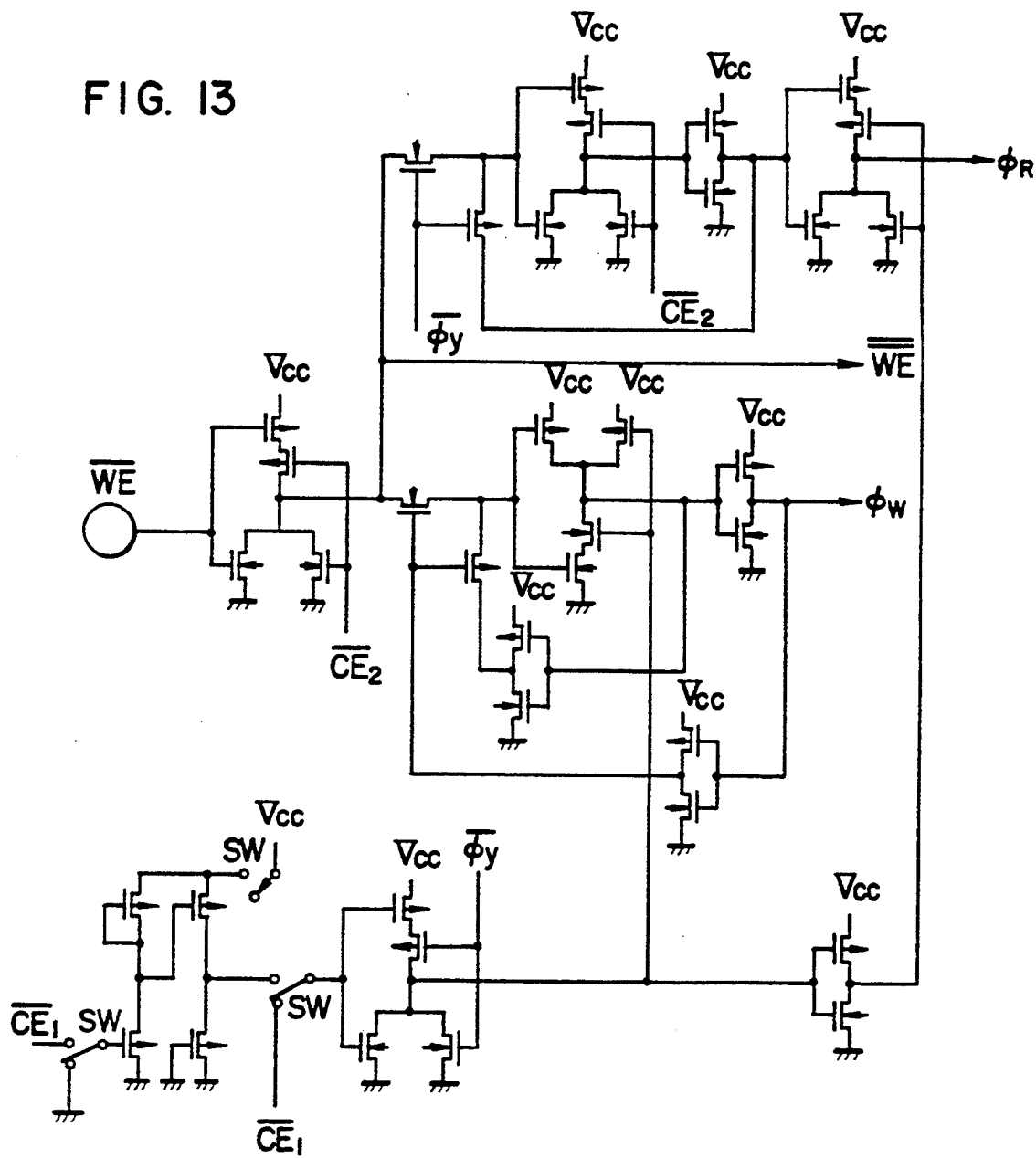
FIG. 13 shows a write enabling buffer circuit employed in the circuit of FIG. 11.

FIG. 13 shows in detail a circuit configuration of the write enabling buffer circuit 63 shown in FIG. 10 which serves to produce internal signals $\Phi_R$, WE and $\Phi_W$ in response to the externally applied write enabling signal $\overline{WE}$. In this case, the exchange between CE and $\overline{CE}$ can be implemented by the master slice technic.

Figure 14:
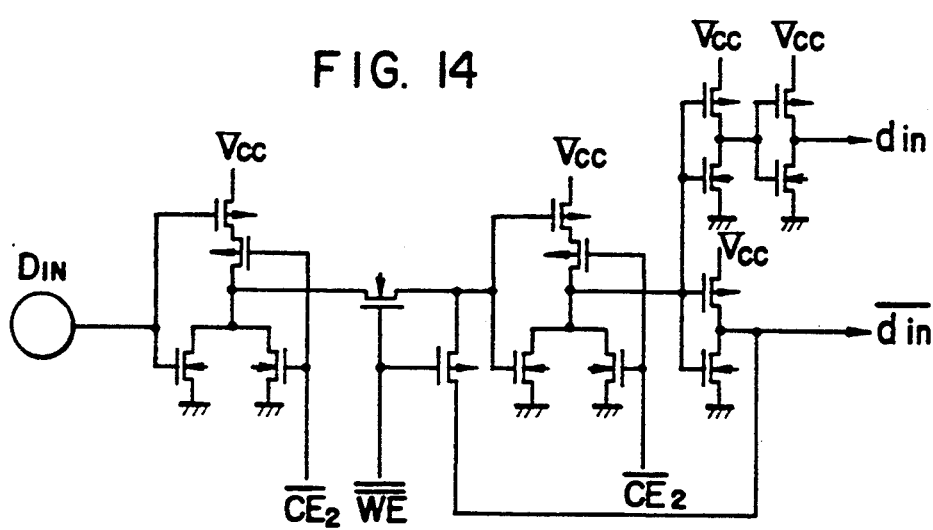
FIG. 14 shows a data input buffer circuit for use in the circuit of FIG. 11.

FIG. 14 is a detailed circuit diagram of the data input buffer circuit 62 shown in FIG. 10 and adapted to produce internal data signals "din" and "$\overline{din}$" in response to the external data input signal $D_{in}$.

Figure 15:
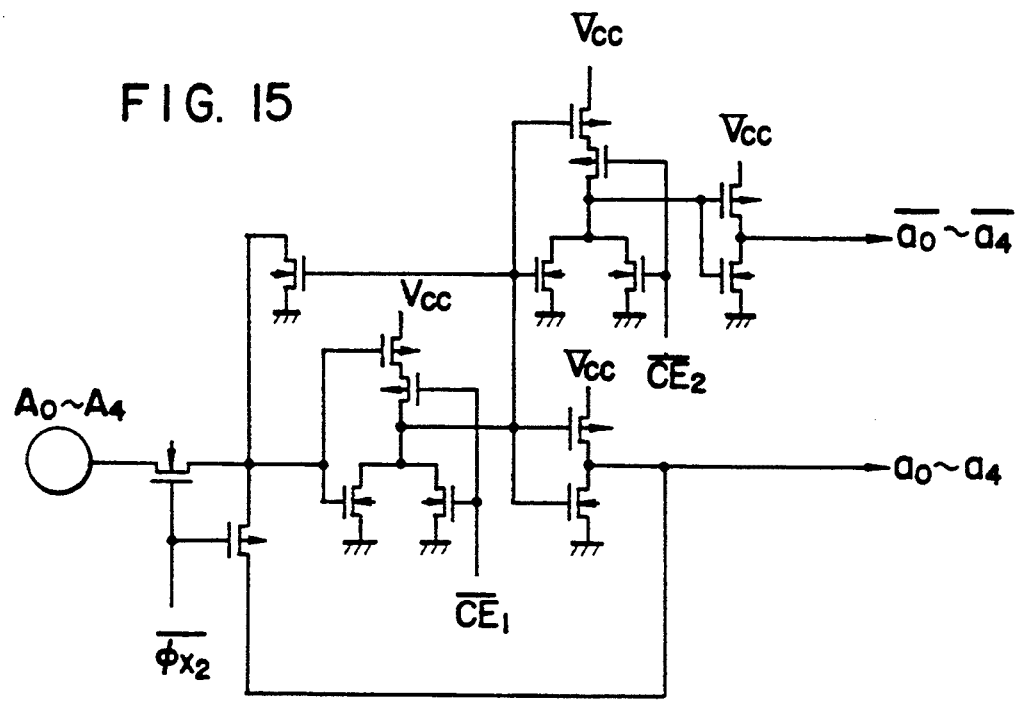
FIG. 15 shows a buffer circuit for externally, applied address signals $A_0$ to $A_4$ as used in the circuit shown in FIG. 11.

FIG. 15 shows a circuit diagram of the address buffer circuits 51 to 54 shown in FIG. 10 which is arranged so as to produce internal address signals $a_0$ to $a_4$ and $\overline{a_0}$ to $\overline{a_4}$ in response to the external address input signals $A_0$ to $A_4$.

Figure 16:
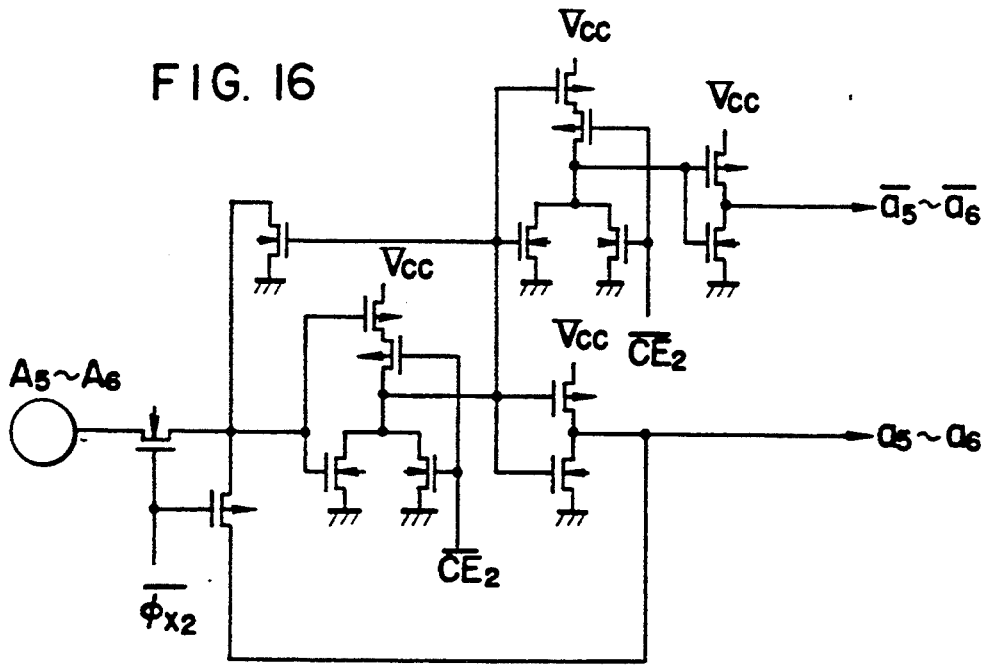
FIG. 16 shows a buffer circuit for externally applied address signals $A_5$ and $A_6$.

FIG. 16 is s detailed circuit diagram of the address buffer circuits 55 and 56 shown in FIG. 10. This circuit serves to produce internally the address control signals $a_5$ and $\overline{a_5}$ as well as address signals $a_6$ and $\overline{a_6}$ in response to the externally applied address signals $A_5$ and $A_6$.

Figure 17:
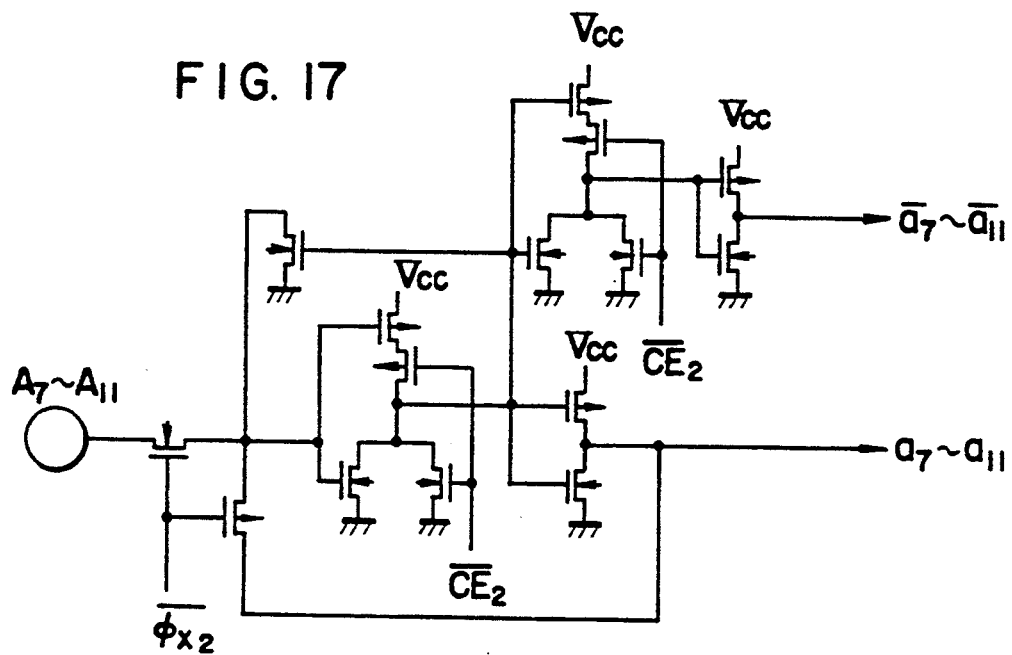
FIG. 17 shows a buffer circuit for externally applied address signals $A_7$ to $A_{11}$.

FIG. 17 shows a circuit arrangement of the address buffer circuits 57 to 61 shown in FIG. 10 which is adapted to produce internal address signals $a_7$ to $a_{11}$ and $\overline{a_7}$ to $\overline{a_{11}}$ in response to the external address signals $A_7$ to $A_{11}$.

Figure 18:
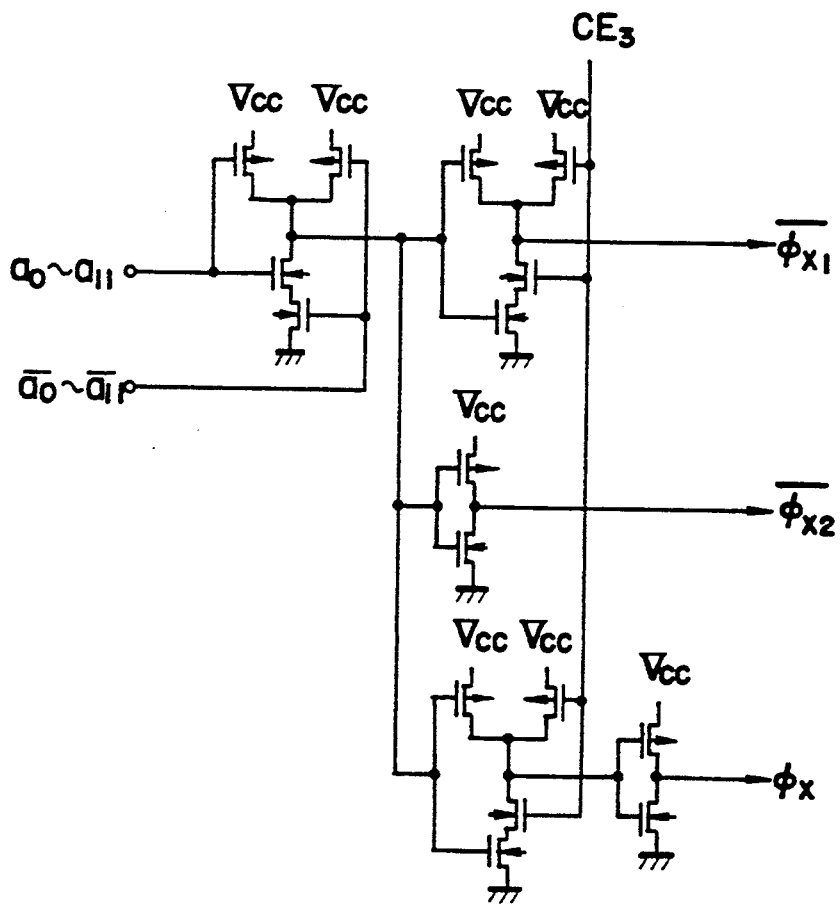
FIG. 18 shows a timing pulse generator circuit for use in the circuit shown in FIG. 11.

FIG. 18 shows a timing pulse generator circuit for producing internal signals $\Phi_x$, $\overline{\Phi_{x1}}$ and $\overline{\Phi_{x2}}$ from the internal address signals $a_0$ to $a_{11}$, $\overline{a_0}$ to $\overline{a_{11}}$ and the internally produced signal $CE_3$.

Figure 19:
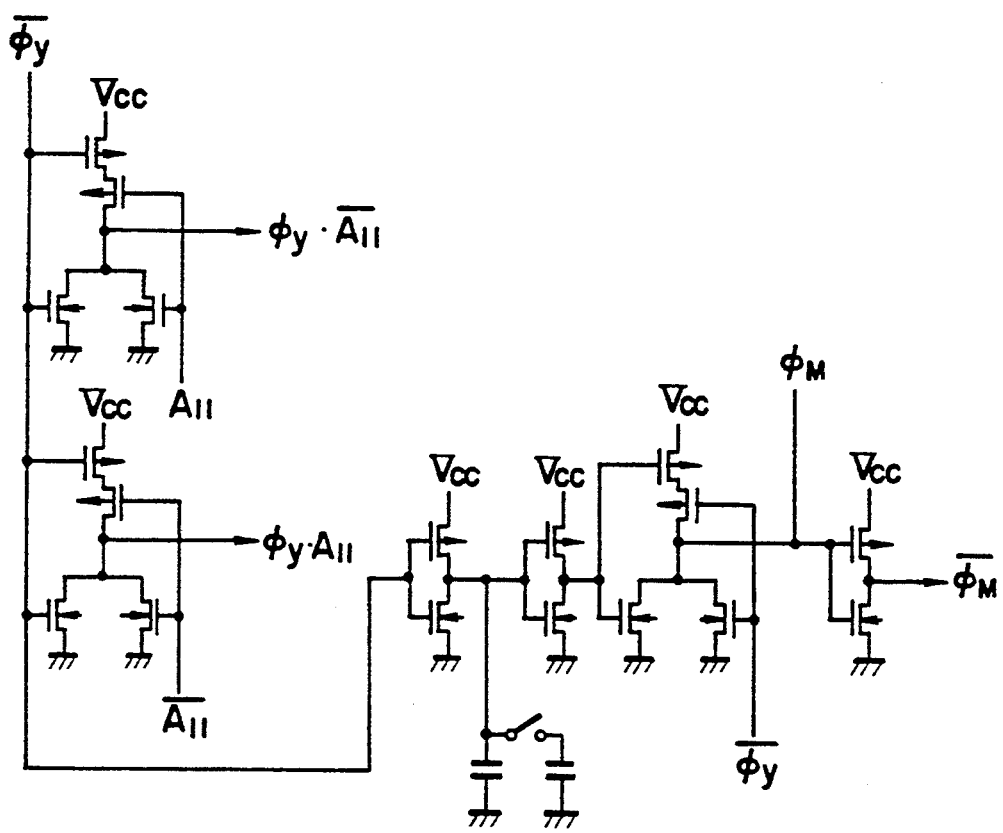
FIG. 19 shows a timing pulse generator circuit also to be used in the circuit shown in FIG. 11.

FIG. 19 shows another timing pulse generator circuit for producing internal signals $\Phi_y \cdot A_{11}$, $\Phi_M$ and $\overline{\Phi_M}$ from the internal produced signal $\Phi_y$.

Figure 20:
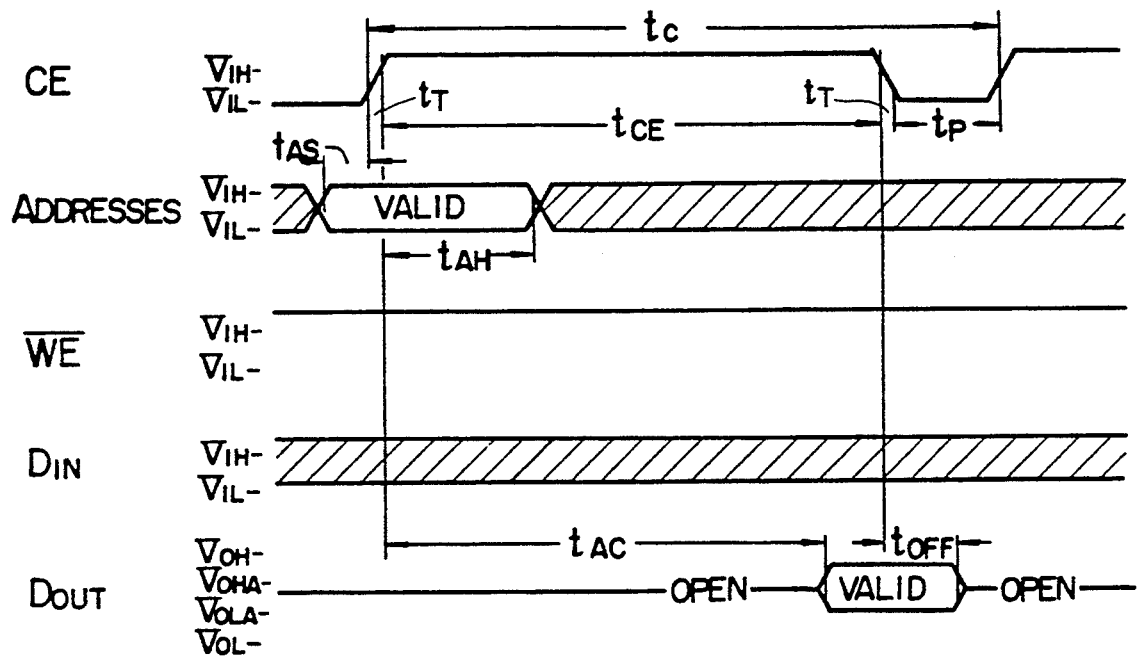
FIG. 20 shows a timing chart for a read cycle.
Figure 21:
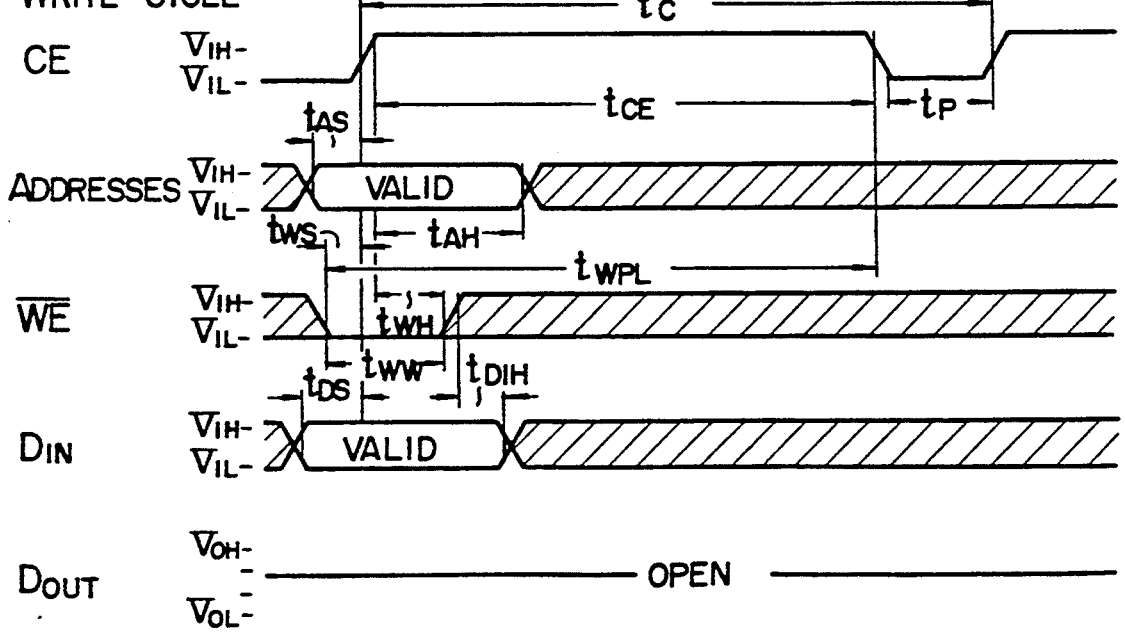
FIG. 21 shows a timing chart for a write cycle.
Figure 22:
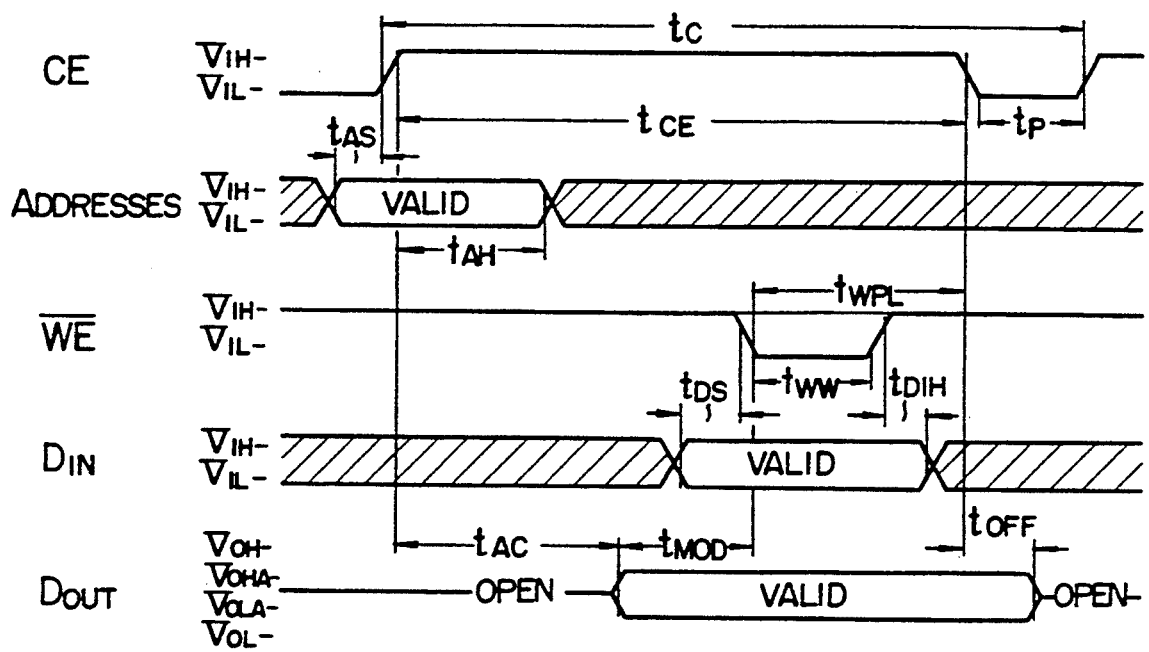
FIG. 22 shows a timing chart for a read and write cycle, FIG. 23 sectional view of a CMIS type semiconductor memory device.

The external signals described are produced in such timing relation as shown in timing charts of FIGS. 20 to 22. In particular, FIG. 20 shows the timing chart for a read cycle, FIG. 21 shows the timing chart for a write cycle and FIG. 22 shows a timing chart for the case in which the read and write operations are excuted in one cycle.

In FIGS. 20 to 22, reference characters denote following time durations:

$t_C$: cycle time
$t_{AC}$: access time
$t_{CE}$: chip enabling duration
$t_p$: chip enabling precharging time
$t_{AH}$: address holding time
$t_{AS}$: address set-up time
$t_{OFF}$: output buffer delay time
$t_{WS}$: write enabling set-up time
$t_{DIH}$: input data holding time
$t_{WW}$: write enabling duration
$t_{MOD}$: modify time
$t_{WPL}$: $\overline{WE}$-to-$\overline{CE}$ transit time
$t_{DS}$: input data set-up time
$t_{WH}$: write enabling holding time
$t_T$: rise-up and breaking time Next, structural features as well as fabrication process of the above mentioned CMIS type semiconductor memory device will be described.

Figure 23:
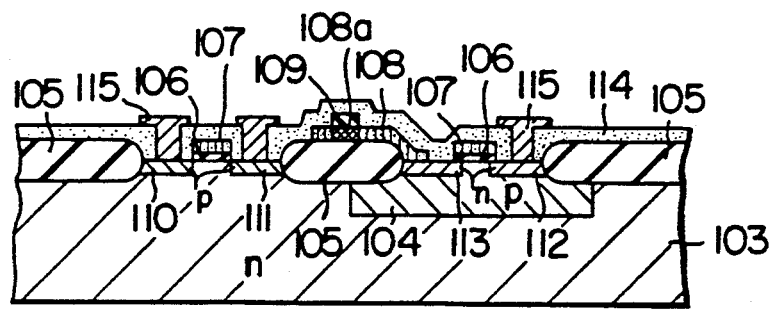

FIG. 23 is a sectional view of such CMIS type semiconductor memory device. In the figure, reference numeral 103 denotes a semiconductor substrate of N-type conductivity, 104 a P-type semiconductor well, 105 a thick film of $SiO_2$, 106 a gate insulating film, 107 a gate electrode of polycrystalline silicon and 108 a polycrystalline silicon layer formed simultaneously with the gate electrode 107. The polysilicon layer 108 is, however, of a high resistivity, because the doping of impurity is prevented at the region 108a through the partial masking by a CVD film 109 of $SiO_2$. The polycrystalline silicon layer 108 thus formed is employed as a high resistance means constituting the load for the memory cell. Reference numeral 110 denotes a source of P-channel MISFET, 111 a drain of the P-channel MISFET, 112 a source of N-channel MISFET, 113 a drain of P-channel MISFET, 114 a PSG film for the surface passivation, and 115 aluminium electrodes.

FIGS. 24A to 24J illustrates stepwise a fabrication process of the above described semiconductor memory device.

1) A major surface of N-type semiconductor substrate 103 is oxidized, thereby to form the $SiO_2$ film 105 which is then partially removed away through photo-etching treatment at the region in which the well is to be formed. Subsequently, the well is subjected to ion implantation. Numeral 116 denotes a photo-resist film (refer to FIG. 24A).

Figure 24A:
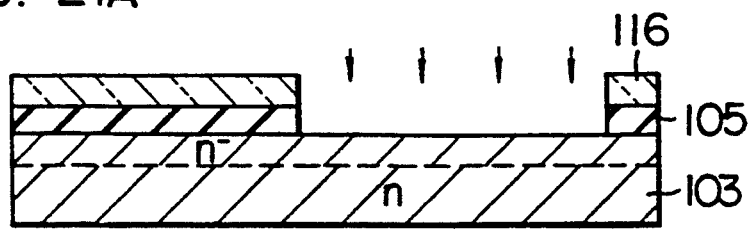
FIGS. 24A to FIG. 24J illustrate stepwise a process of fabricating a semiconductor memory device shown in FIG. 23.
Figure 24B:
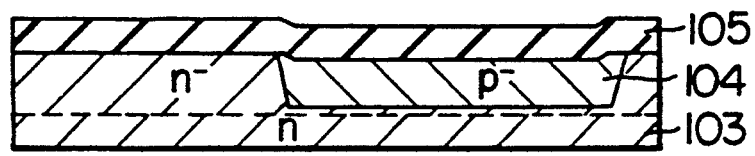
Figure 24C:
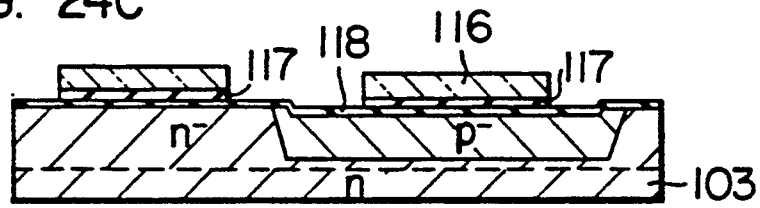
Figure 24D:
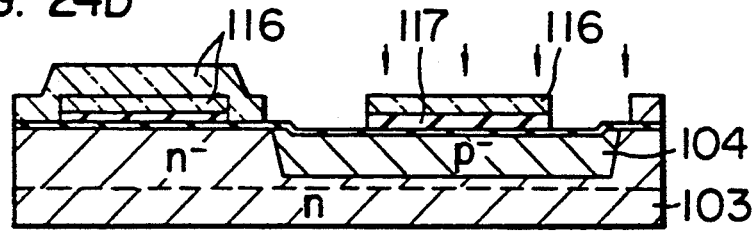
Figure 24E:
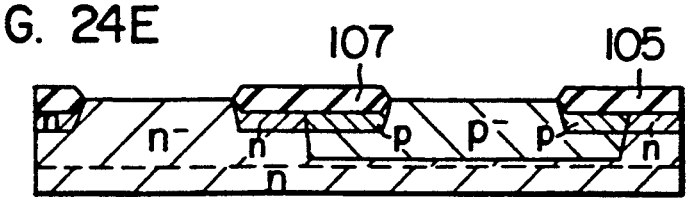
Figure 24F:
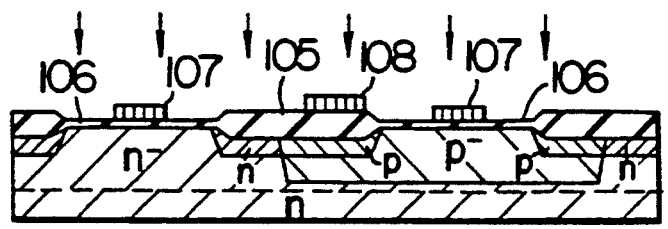
Figure 24G:
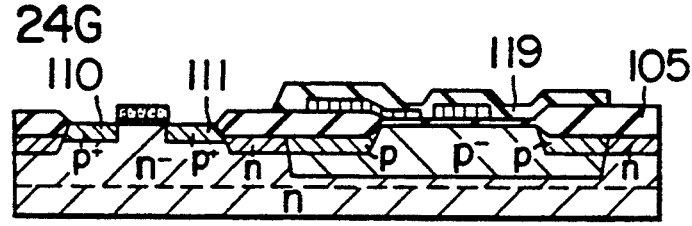
Figure 24H:
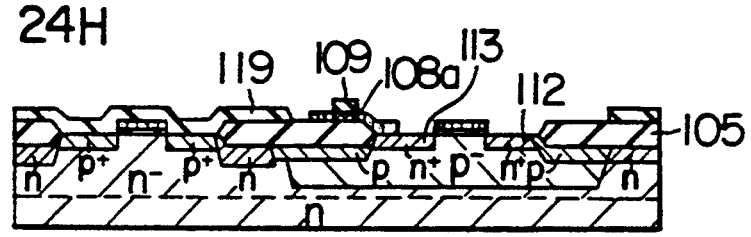

2) Thereafter, a P-type impurity substance is diffused to form the P-type semiconductor well 104 (refer to FIG. 24B).

3) After the $SiO_2$ film 105 formed on the semiconductor surface is removed, a thin insulation film 118 is formed on the surface and then nitride ($Si_3N_4$) film 17 is formed thereon through deposition. Subsequently, the photo-resist film 116 is formed to be used as a mask for selectively removing the nitride film 117 through photo-etching (refer to FIG. 24C).

4) Photo-resist film 116 is formed over the semiconductor surface except for the well region. In this state, the ion implantation is carried out (refer to FIG. 24C).

5) Starting from the state just above described, selective oxidization is conducted with the nitride film 117 being used as the mask, thereby to form an isolation film for isolating active element from one another. Then, the nitride film 117 used as the mask is removed. The rear surface of the semiconductor substrate 103 is also etched (refer to FIG. 24E).

6) The semiconductor surface is subjected to thermal oxidization to form the gate insulation film 106 and followed by the formation of the polycrystalline silicon layers 107 and 108. The layer 107 constitutes the gate electrode, while the layer 108 constitutes the high resistance means to provide the load for the memory cell. After the polycrystalline silicon layers 107 and 108 have been formed, ion implantation is effected at a low concentration, thereby to adjust the resistivity of the load region at a predetermined value (refer to FIG. 24F).

7) A mask 119 is formed over the semiconductor well 104. In this state, windows are provided for P-type impurity diffusion to form the source and drain regions of P-channel MISFET (refer to FIG. 24G).

8) The mask is then removed. The P-channel portion in turn is covered by the mask 119. Simultaneously, a portion of the polycrystalline silicon layer 108 is also covered by the mask, with a view to protecting the latter from impurity diffusion, thereby to maintain the high resistivity. In this state, windows for N-type impurity diffusion is provided to form the source 112 and the drain 113.

Figure 24I:
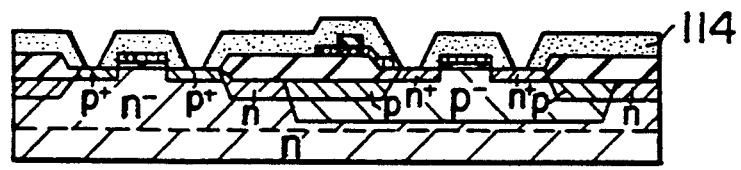
Figure 24J:
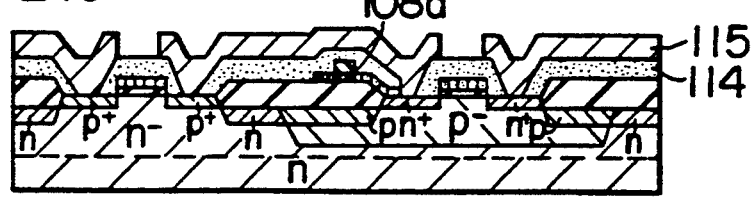

9) Thereafter, PSG film 114 is formed and subjected to the photo-etching treatment so as to form windows for leading out electrodes (refer to FIG. 24I).

10) Finally, aluminium electrodes are formed.

The above described embodiment of the invention brings about following advantages;

a. The resistivity of the high resistance region formed of polycrystalline silicon serving as a load for the memory cell is so selected that the resistance region can be made in an extremely small area and that the load resistor may supply a very small current therethrough to compensate the leakage of electric charge representing the written information stored in the memory cell, which leakage would occur before the memory cell is refreshed. For example, the resistivity may be on the order of 10 GΩ. It will be appreciated that such leakage is ascribable to the current flowing through parasitic capacitance at the junction and the tailing current flowing through the MISFET in the OFF state. The semiconductor memory device according to the invention can thus be operated as a static memory without requiring periodical refreshing of the memory cell by virtue of the fact that only a small current may be supplied to the information storing means (or capacitor) through the polycrystalline silicon resistor for compesation of the possible current leakage.

On the other hand, dynamic operation can be effected in the interface circuit for the memory cell by actuating the precharging circuits (PC, $PC_1$, $PC_4$...) by the chip enabling signal. Of course, it is also possible to operate the circuit in the static mode without resorting to the clock drive by using the precharging circuit. In the latter case, the semiconductor memory of the static memory type can be accomplished with substantially the same cell area as that of the memory cell of the flip-flop memory cell of the dynamic type constituted by four MOSFET's. In this connection, it has been found that the cell area of the semiconductor memory device according to the invention is significantly reduced to 0.38 in area ratio as compared with the cell area of the memory cell of a static memory device of a flip-flop configuration constituted by six MOSFET's (6 MOS-memory cell) and including an enhancement type MOSFET as the load means. Further, when compared with the 6 MOS-memory cell which includes a depletion type MOSFET as the load means which allows the memory cell area to be reduced as is well known in the art, the cell area of the memory device according to the invention can be much reduced to 0.65 to 1 in area ratio. Besides, the cell area of the memory device according to the invention can be remarkably reduced to 0.31 to 1 in area ratio relative to that of the CMOS type memory cell. In the case of CMOS-type memory device, the well junction has to be interposed between the P-channel MOSFET and N-channel MOSFET, which necessarily requires a rather great distance between the P- and N-channel MOSFET's and thus provides a major cause to degradation in the integration density. On the contrary, the memory cell according to the invention is constituted by one channel type MISFET of the complementary MIS circuit without use of the other channel-type MISFET. Thus, a large distance is not required between these MISFET elements, whereby integration density can be significantly increased.

b. Since the load means is composed of a polycrystalline silicon resistor having a high resistivity, the current flowing therethrough is restricted to a degree which allows the memory to be refreshed, power consumption can be reduced to a substantially same level as that of the complementary MIS-type memory. Of course, no circuit is required for the refreshing. On the other hand, a complementary MIS-type circuit is employed in the interface circuit to take advantage of such CMIS circuit.

c. Since the polycrystalline silicon layer forming the load means can be formed integrally with the polycrystalline silicon layer for applying the source voltage to the load means, no specific area for providing contact between the load and the lead layer is required, which also contributes to reduction in the area of the memory device. More particularly, in the memory matrix or array comprising a plurality of memory cells according to the invention, the source voltage line and the load means can be formed by an integral polycrystalline silicon layer, wherein the source voltage line is connected to the pad of the aluminium wiring at the outside of the memory matrix. Thus, the number of connections or contacts between the source voltage line and the aluminium wiring can be significantly decreased. This feature is not restricted to the memory cell, but can be applied generally to semiconductor devices incorporating therein inverter devices composed of driver means connected to the ground terminal and a load means connected to the terminal to which the source voltage is applied.

(d) Since the N-MOS memory array transistors are formed in a P-well 104 within the N-type substrate, as shown in FIG. 23 and FIGS. 24H-J, a pn junction is formed between the P-well 104 and the substrate that will serve to reduce soft errors caused by carriers generated in the substrate due to alpha particles or the operation of MOSFETs in the peripheral circuit. This is particularly important in the present invention because, without such a P-well 104, the memory cell transistors would be much more susceptible to such soft errors than prior art N-MOS memory cell transistors. The reason for this is that the very high values of resistance which are desirable to use for the memory cell transistors serve to reduce the current in these transistors to a level where the stored charge would be highly susceptible to soft error. Therefore, using the P-well 104 permits lowering the current, thereby reducing power consumption, by using high resistance polycrystalline silicon resistors, without rendering the memory array useless because of soft error.

We claim:

1. A static random access memory device comprising:
a plurality of memory cells disposed on a semiconductor substrate in rows and columns, each memory cell consisting essentially of two cross-coupled field effect transistors, two transmission field effect transistors and two load means, wherein the two load means are comprised of polycrystalline silicon strips; and
a peripheral circuit connected to the memory cells,
wherein the transistors of the memory cells are formed as N-channel field effect transistors in a P-conductivity type well region formed within an N-conductivity substrate, which well region forms a PN-junction with the substrate, and
wherein the peripheral circuit is comprised of complementary field effect transistors formed on the same substrate.

2. A static random access memory device comprising:
a substrate of semiconductor material of N-conductivity type;
an array of memory cells fabricated on said substrate in rows and columns;
each of said memory cells of said array consisting essentially of first and second driving transistors, first and second transmission transistors, and first and second load means, each of said transistors being of N-channel insulated gate field effect type, and having a gate, a source diffused region and a drain diffused region formed in said substrate, each of said first and second load means being comprised of polycrystalline silicon material formed on an insulating film covering said substrate;
each gate of said first and second driving transistors being cross-coupled to the drain of the other driving transistor in a respective memory cell;
each source region of said first and second driving transistors being coupled to a first ground line;
source-drain paths of said first and second transmission transistors being coupled between the drains of said first and second driving transistors and associated data lines, respectively, in a respective memory cell;
said first and second load means being respectively coupled between a first power source line and respective drains of said first and second driving transistors in a respective memory cell; and
a peripheral circuit formed on said substrate and coupled to said data lines, said peripheral circuit including a P-channel metal insulated gate field effect type transistor and an N-channel metal insulated gate field effect type transistor which are connected in series with each other between a second power source line and second ground line,
wherein said source and drain diffused regions of said first and second driving transistors and said source and drain diffused regions of said first and second transmission transistors of each memory cell are formed in a well region of P-conductivity type which forms a PN-junction with said substrate of N-conductivity type.

3. An integrated circuit static random access memory as claimed in claim 2, wherein said peripheral circuit includes decoder circuits and sensing circuits.

4. An integrated circuit static random access memory as claimed in claim 2, wherein said polycrystalline silicon material of said first and second load means has an impurity concentration corresponding to a dosage of ions less than $10^{15}$ per $cm^3$.

5. A static random access memory device according to claim 2, wherein said power source line is comprised of polycrystalline silicon material.

6. A static random access memory device according to claim 5, wherein said load means are unitary with said power source line, and wherein said load means and said power source line are comprised of said polycrystalline silicon material.

7. A static random access memory device comprising:
a substrate of semiconductor material, of N-conductivity type;
an array of memory cells formed on said substrate in rows and columns, each of said memory cells consisting essentially of four N-channel metal insulated gate field effect transistors and load means comprising polycrystalline silicon, the first and second of said four transistors being cross-coupled to each other to provide a flip-flop circuit while the third and fourth transistors are coupled to said cross-coupled pair of transistors to provide transmission paths of data, said load means coupling a power source line to said cross-coupled pair of transistors;

a plurality of word lines arranged substantially in parallel with each other, each being coupled to gate electrodes of said third and fourth transistors of each memory cell arranged in a row of said memory cells, and a plurality of data lines substantially parallel with each other, arranged substantially orthogonally to said word lines, a pair of said data lines being coupled to the source-drain paths of said third and fourth transistors of each memory cell arranged in a column of said memory cells; and a peripheral circuit formed on said substrate and coupled to the plural word and data lines, said peripheral circuit comprising a P-channel metal insulated gate field effect transistor and an N-channel metal insulated gate field effect transistor connected in series with each other, wherein said four transistors of each memory cell are formed in a well region of P-conductivity type which forms a PN-junction with said substrate.

8. A static random access memory device as claimed in claim 7, wherein said peripheral circuit includes a first decoder circuit coupled to said plural word lines, and a second decoder circuit and a sense circuit which are coupled to sad plural data lines.

9. A static random access memory device as claimed in claim 7, wherein said peripheral circuit includes sense circuits each being coupled to said pair of data lines, and wherein each sense circuit comprises a pair of inverters of P-channel and N-channel metal insulated gate field effect transistors and connection means for cross-coupling said pair of inverters to provide a flip-flop circuit.

10. A static random access memory device as claimed in claim 7, wherein each of said load means includes a portion having an impurity concentration corresponding to a dosage of ions less than $10^{15}$ per $cm^3$.

11. A static random access memory device according to claim 7, wherein said power source line is comprised of polycrystalline silicon material.

12. A static random access memory device according to claim 11, wherein said power source line is unitary with said load means.

13. A static random access memory device according to claim 12, wherein said power source line is arranged in parallel with said plurality of word lines.

14. A static random access memory device comprising:

a substrate of semiconductor material, said substrate having a portion of N-conductivity type;

an array of memory cells formed on said substrate in rows and columns, each of said memory cells consisting essentially of first and second driving transistors, first and second transmission transistors of N-channel metal insulated gate field effect transistors and first and second load means comprising polycrystalline silicon, each of said transistors having a gate, a source diffusion region, and a drain diffusion region formed in said portion, said first and second driving transistors being cross-coupled to each other, and said source diffused regions of said first and second driving transistors being coupled to a first ground line while said first and second transmission transistors are coupled to said cross-coupled pair of driving transistors, said load means coupling a first power source line to said cross-coupled pair of driving transistors;

a plurality of word lines arranged substantially in parallel with each other, each being coupled to gate electrodes of said first and second transmission transistors of each memory cell arranged in a row of said memory cells;

a plurality of data lines substantially parallel to each other, arranged substantially orthogonally to said word lines, a pair of said data lines being coupled to the source-drain paths of said first and second transmission transistors of each memory cell arranged in a column of said memory cells; and a peripheral circuit formed on said substrate and coupled to the plural word and data lines, said peripheral circuit comprising a P-channel metal insulated gate field effect transistor and an N-channel metal insulated gate field effect transistor connected in series with each other between a second power source line and a second ground line, wherein said first and second driving transistors and said first and second transmission transistors of each memory cell are formed in a well region of P-conductivity type which forms an PN-junction with said portion of said substrate.

* * * * *